United States Patent
Roth et al.

(10) Patent No.: US 7,206,987 B2
(45) Date of Patent: Apr. 17, 2007

(54) ERROR DETECTION AND CORRECTION IN A LAYERED, 3-DIMENSIONAL STORAGE ARCHITECTURE

(75) Inventors: Ron M. Roth, Haifa (IL); Gadiel Seroussi, Cupertino, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 465 days.

(21) Appl. No.: 10/427,525

(22) Filed: Apr. 30, 2003

(65) Prior Publication Data

US 2004/0221220 A1 Nov. 4, 2004

(51) Int. Cl.
*H03M 13/29* (2006.01)
(52) U.S. Cl. .................................. 714/755; 714/763
(58) Field of Classification Search ............... 714/755, 714/763, 758
See application file for complete search history.

(56) References Cited

U.S. PATENT DOCUMENTS

| | | | | |
|---|---|---|---|---|
| 5,708,667 A * | 1/1998 | Hayashi | ............... | 714/755 |
| 5,784,352 A * | 7/1998 | Swanson et al. | ............... | 369/94 |
| 5,920,578 A * | 7/1999 | Zook | ............... | 714/755 |
| 6,069,868 A * | 5/2000 | Kashiwagi | ............... | 369/275.1 |
| 6,160,787 A * | 12/2000 | Marquardt et al. | ............... | 369/275.1 |
| 6,581,178 B1 * | 6/2003 | Kondo | ............... | 714/758 |
| 6,606,293 B1 * | 8/2003 | Okada et al. | ............... | 369/94 |
| 6,611,939 B1 * | 8/2003 | Noguchi | ............... | 714/764 |
| 6,625,775 B1 * | 9/2003 | Kim | ............... | 714/755 |
| 6,628,591 B1 * | 9/2003 | Yokota et al. | ............... | 369/53.21 |
| 6,633,535 B1 * | 10/2003 | Asada | ............... | 369/286 |
| 6,647,471 B2 * | 11/2003 | March et al. | ............... | 711/154 |
| 6,663,935 B1 * | 12/2003 | Kashiwagi et al. | ............... | 428/64.2 |
| 6,678,237 B1 * | 1/2004 | Edwards et al. | ............... | 369/286 |
| 6,700,862 B2 * | 3/2004 | Tsukuda et al. | ............... | 369/275.4 |
| 6,738,335 B1 * | 5/2004 | Todori et al. | ............... | 369/94 |
| 6,744,709 B2 * | 6/2004 | Kobayashi | ............... | 369/44.25 |
| 6,845,481 B2 * | 1/2005 | Gueguen et al. | ............... | 714/755 |
| 6,889,352 B2 * | 5/2005 | Hirayama | ............... | 714/774 |
| 7,014,815 B1 * | 3/2006 | Worthington et al. | ............... | 422/82.05 |
| 2002/0162072 A1 * | 10/2002 | Thesling | ............... | 714/777 |
| 2003/0093740 A1 * | 5/2003 | Stojanovic | ............... | 714/752 |
| 2003/0126548 A1 * | 7/2003 | Chapalain et al. | ............... | 714/786 |

OTHER PUBLICATIONS

Kasahara, M., et al., "New Classes of Binary Codes Constructed on the Basis of Concatenated Codes and Product Codes", IEEE Transactions on Information Theory, vol. 22, No. 4, pp. 462-468.*

Roth, R., "Maximum-Rank Array Codes and Their Application to Crisscross Error Correction", IEEE Transactions on Information Theory, vol. 37, No. 2, pp. 328-336.*

Kasahara, M., et al., "New Classes of Binary Codes Constructed on the Basis of Concatenated Codes . . . ", (IEEE Transactions on Information Theory, vol. 22, Issue 4, Jul. 1976.

Roth, R.M., "Maximum-rank Array Codes and Their Application to Crisscross Error Correction," (abstract) IEEE Transactions on Information Theory, vol. 37, Issue 2, Mar. 1991.

Roth, R.M. et al., "Reduced-redundancy Product Codes for Burst Error Correction," (abstract) IEEE Transactions on Information Theory, vol. 44, Issue 4, Jul. 1998.

* cited by examiner

*Primary Examiner*—Stephen M. Baker

(57) ABSTRACT

A method and system for space-efficient error-control coding for encoding data into a 3-dimensional data-storage medium. The method and system enables the detection and correction of a bounded number of certain types of errors corresponding to the known failure modes of a class of 3-dimensional data-storage media.

5 Claims, 27 Drawing Sheets

| F | D | C | B | A |
|---|---|---|---|---|
| a | 0 | 0 | 0 | 0 |
| b | 0 | 0 | 0 | 1 |
| c | 0 | 0 | 1 | 0 |
| d | 0 | 0 | 1 | 1 |
| e | 0 | 1 | 0 | 0 |
| f | 0 | 1 | 0 | 1 |
| g | 0 | 1 | 1 | 0 |
| h | 0 | 1 | 1 | 1 |
| i | 1 | 0 | 0 | 0 |
| j | 1 | 0 | 0 | 1 |
| k | 1 | 0 | 1 | 0 |
| l | 1 | 0 | 1 | 1 |
| m | 1 | 1 | 0 | 0 |
| n | 1 | 1 | 0 | 1 |
| o | 1 | 1 | 1 | 0 |
| p | 1 | 1 | 1 | 1 |

(rows a–p grouped as $q$)

ERROR DETECTION AND CORRECTION IN A LAYERED, 3-DIMENSIONAL STORAGE ARCHITECTURE

TECHNICAL FIELD

The present invention relates to detecting and correcting errors in stored data and, in particular, to a space-efficient method for encoding data in layered, 3-dimensional memories to allow for detecting and correcting certain classes of expected errors.

BACKGROUND OF THE INVENTION

The present invention is related to error-code correction that generally allows for errors that arise during transmission, storage, and retrieval of electronic data to be detected and, in many cases, to be corrected. Many linear-block-encoding error-control coding methods and techniques are well known for encoding serially transmitted data that can be broken up into k-length messages. In general, the storage models for data to which the currently available error-control coding techniques are applied are linear and 2-dimensional arrangements of words within a storage device. Techniques have been developed for recognizing and correcting certain types of errors in 2-dimensional memories, including criss-cross errors, described in a following subsection. Many of these techniques employ systematic linear codes, also described below. A number of these methods are described in "Theory of Codes with Maximum Rank Distance," Gabidulin, *Probl. Peredach. Inform.*, 21, pp. 3–16 (1985); "Optimal Array Error-Correcting Codes," Gabidulin, *Probl. Peredach. Inform.*, 21, pp. 102–106 (1985); and "Reduced-Redundancy Product Codes for Burst Error Correction," Roth and Seroussi, *IEEE Trans. Inform. Theory*, 44, pp. 1395–1406(1998).

Recently, a new class of 3-dimensional storage devices has been developed. It is anticipated that the failures modes for this class of 3-dimensional storage devices will require an efficient, 3-dimensional-data error-control coding technique that provides high ratios of data words to the total number of words of encoded data stored within the 3-dimensional data storage media, in order to provide a greater maximum storage capacity within a 3-dimensional data-storage device of a given size.

SUMMARY OF THE INVENTION

One embodiment of the present invention provides a space-efficient, error-control coding technique for encoding data into a 3-dimensional data-storage medium using a product code and several linear block codes. This technique enables the detection and correction of a bounded number of certain types of errors corresponding to the known, probable failure modes of a class of 3-dimensional data-storage media.

DETAILED DESCRIPTION OF THE INVENTION

One embodiment of the present invention is a space-efficient technique for encoding data into a 3-dimensional data-storage medium. An embodiment of the present invention, described below, involves the recognition and characterization of failure modes of a class of 3-dimensional data-storage media, selection of, and combination of, certain error-control encoding techniques, and implementation of a method using the selected and combined error-control encoding techniques to detect and correct certain failure modes of the class of 3-dimensional data-storage media. Accordingly, this section is divided into the following three subsections: (1) Description Of A Class Of 3-Dimensional Data-Storage Media And Characterization Of Failure Modes Of The Class Of 3-Dimensional Data-Storage Media; (2) Mathematical Description Of Selected Error-Control Encoding Techniques; and (3) Implementation Of A Method That Represents One Embodiment Of The Present Invention.

Figure 1:
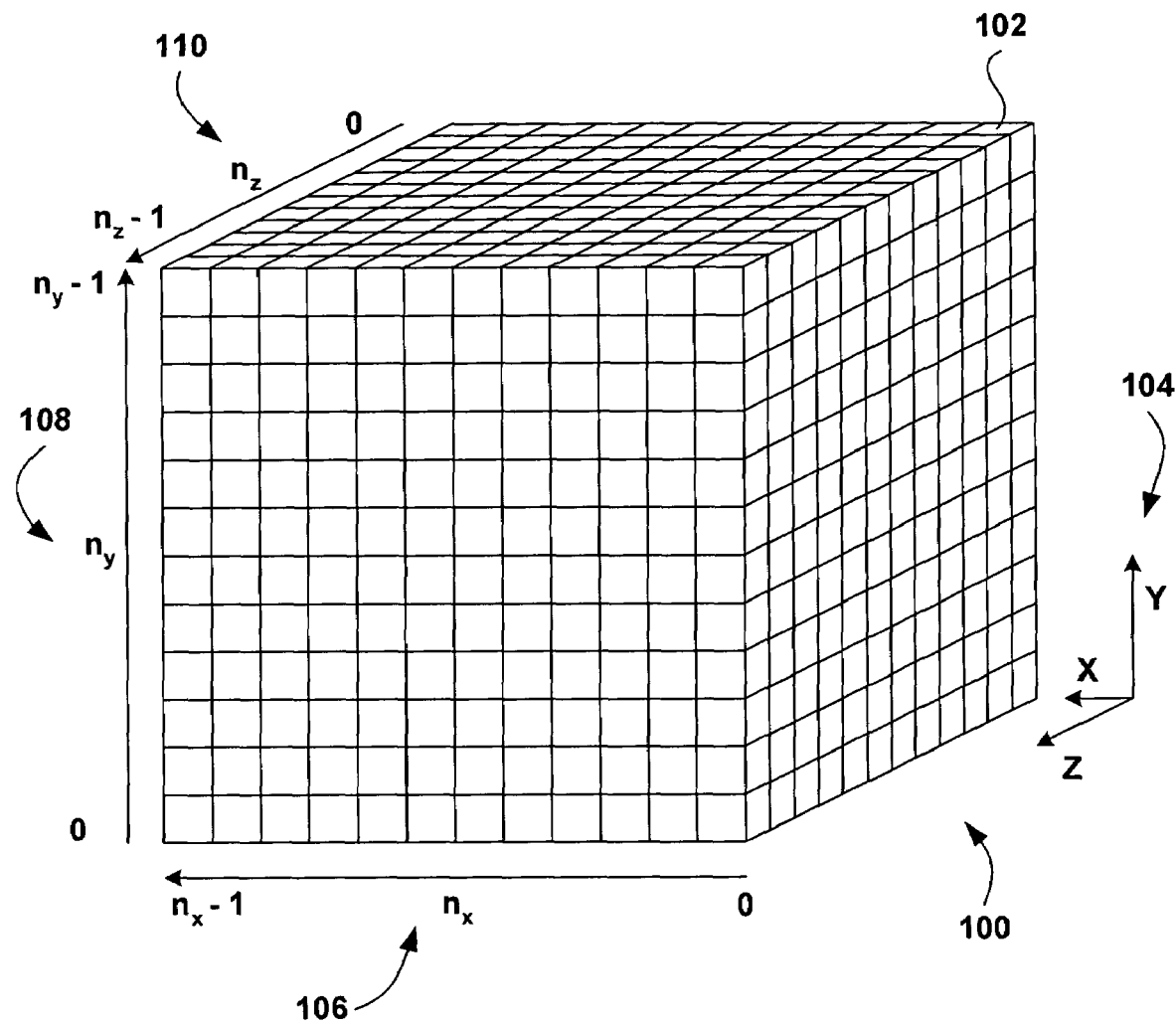
FIG. 1 illustrates a 3-dimensional data-storage medium into which data is encoded by a method representing one embodiment of the present invention.

Description of a Class of 3-Dimensional Data-Storage Media and Characterization of Failure Modes of the Class of 3-Dimensional Data-Storage Media FIG. 1 illustrates a 3-dimensional data-storage medium into which data is encoded by a method representing one embodiment of the present invention. The data-storage medium can be considered to be a solid rectangle comprising a number of cells, or data-storage units, such as cell 102. The data-storage medium is characterized by dimensions, or number of data-storage units, along edges parallel to three orthogonal axes, x, y, and z 104. In this and subsequent figures and descriptions, a non-traditional, left-hand coordinate system is used. Thus, the 3-dimensional data-storage medium illustrated in FIG. 1 has dimensions $n_x$, $n_y$, and $n_z$, with the x-axis directed to the left 106, the y-axis directed upward 108, and the z-axis directed outward from the plane of the paper 110. In subsequent discussions, a 3-dimensional data-storage volume V may be notationally described as a set of data-storage units with indices i, j, and l, as follows:

$$\{(i, j, l): 0 \leq i < n_x, 0 \leq j < n_y, 0 \leq l < n_z\}$$

In a following pseudocode implementation, each element of the 3-dimensional data-storage volume V may be specified by indices x, y, and z corresponding to the x-axis, y-axis, and z-axis, as follows:

$$V[x][y][z]$$

An embodiment of the present invention is described with respect to the encoding of data into a single 3-dimensional data-storage volume V. In general, an actual 3-dimensional data-storage medium will comprise hundreds of thousands, millions, or even billions of individual 3-dimensional data volumes, such as 3-dimensional data volume V illustrated in FIG. 1, and the described embodiment of the present invention may be successively applied to each of the 3-dimensional data volumes, in a well-defined order, within the entire 3-dimensional data-storage medium.

Figure 2:
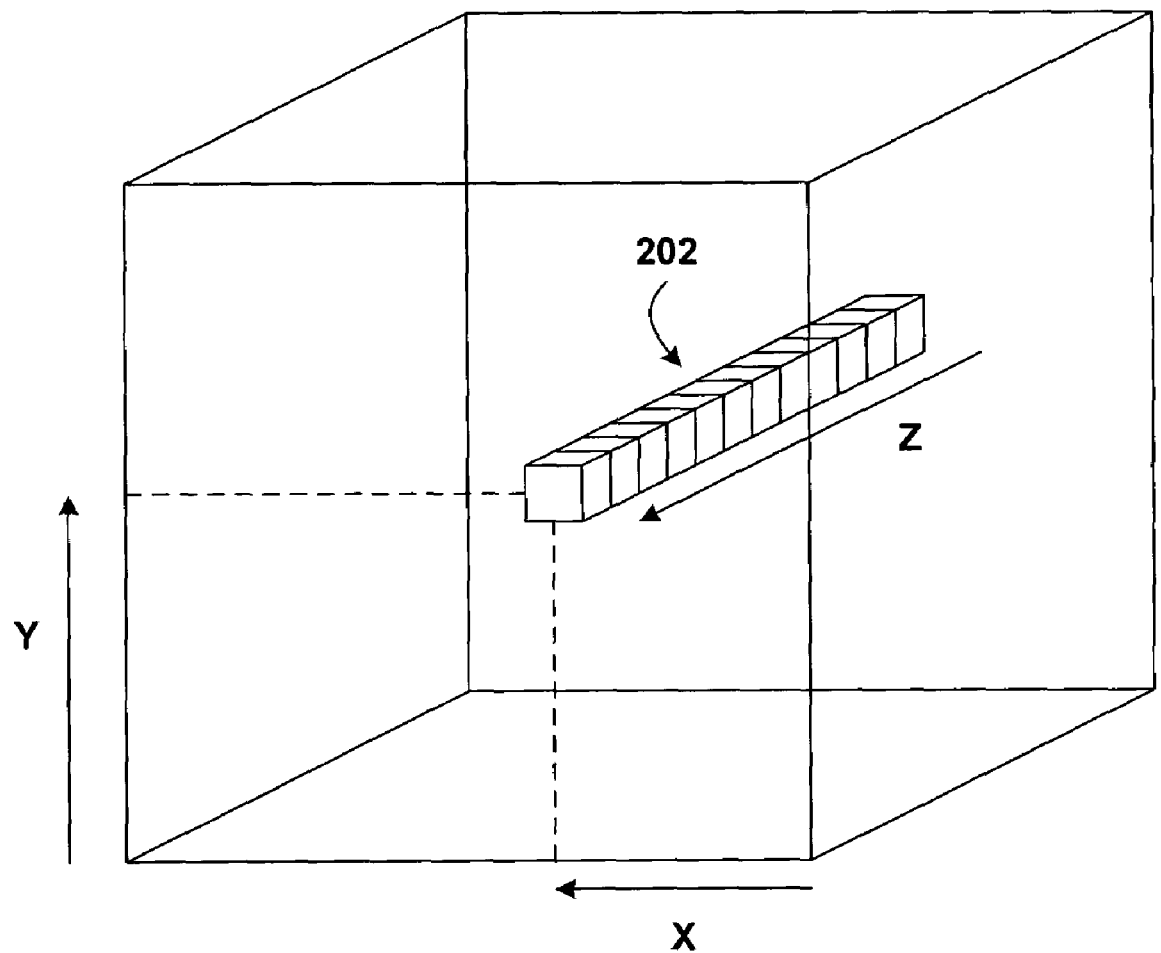
FIG. 2 shows a z-line within the 3-dimensional data-storage volume V.

Several types of subsets of the data-storage units within a single 3-dimensional data-storage volume V are employed in the following discussion and in a pseudocode implementation, provided below. The first type of subset, or partition, is referred to as a "z-line." FIG. 2 shows a z-line within the 3-dimensional data-storage volume V. A z-line is a set of data-storage units that all have identical x-axis and y-axis coordinates or, in other words, a z-line specified by x and y coordinates "a" and "b" can be described notationally as:

$$\{(i, j, l): i=a, j=b, 0 \leq l < n_z\}.$$

A z-line may also be notationally specified as "$V_{xy}$," and a particular data-storage unit within a z-line may be specified and accessed in the pseudocode routines using the notation "$V_{xy}[z]$." As can be seen in FIG. 2, az-line 202 is essentially a linear array of data-storage units oriented in the direction of the z-axis.

Figure 3:
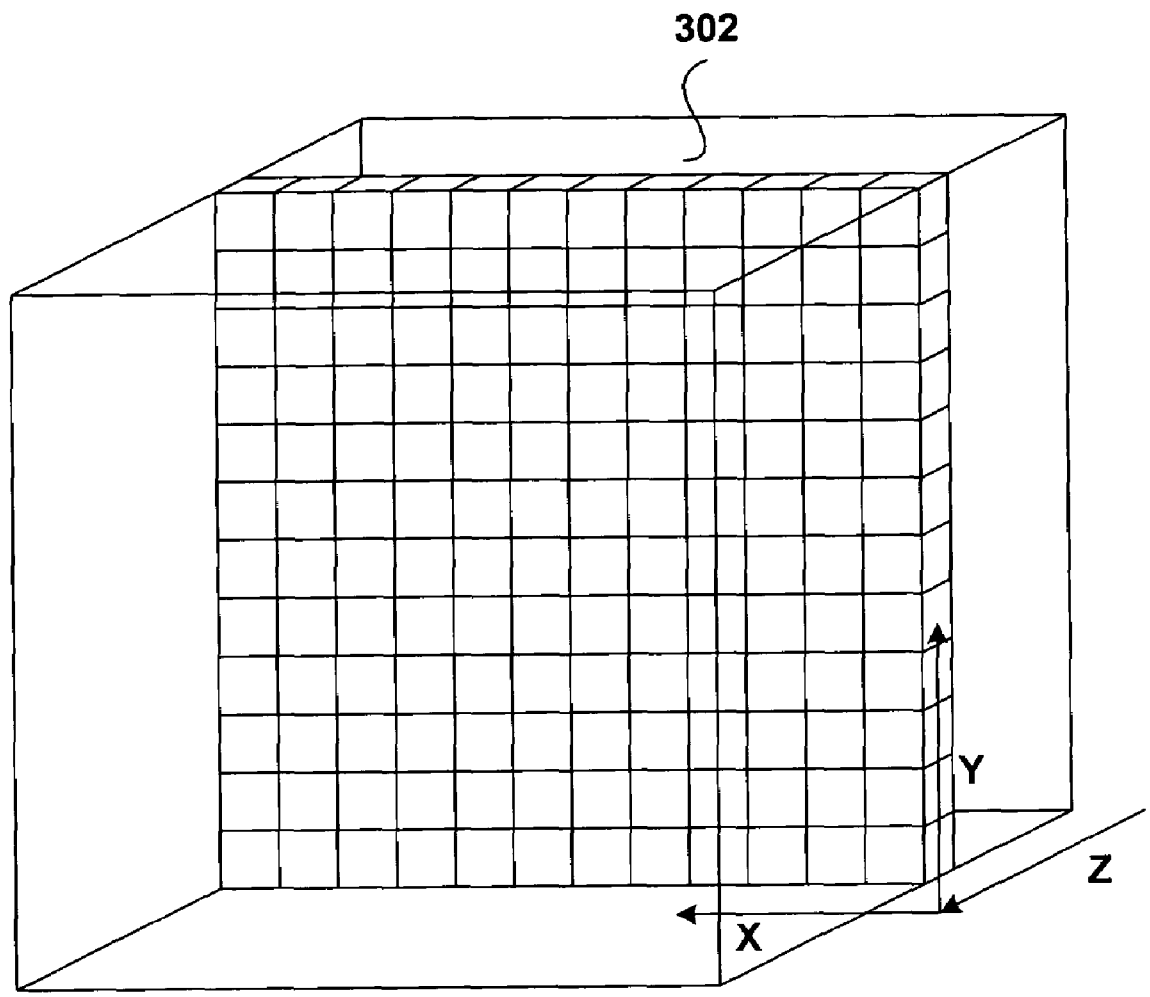
FIG. 3 illustrates an xy-slice within the 3-dimensional data-storage volume V.

A second type of subset, or partition, of data-storage units is referred to as an "xy-slice." FIG. 3 illustrates an xy-slice within the 3-dimensional data-storage volume V. As shown in FIG. 3, an xy-slice is a plane of data-storage units within the data-storage volume V normal to the z-axis. All the data-storage units within an xy-slice have identical z indices. Thus, an xy-slice at z-axis coordinate "c" can be specified as:

$$\{(i, j, l): 0 \leq i < n_x, 0 \leq j < n_y, l=c\}$$

or, alternatively, as:

In the pseudocode routines that describe one embodiment of the present invention, a data element within an xy-slice may be specified and accessed via the notation "$V_z[x][y]$." Additional subsets include yz-slices, $V_x$, xz-slices $V_y$, x-lines $V_{yz}$, and y-lines $V_{xz}$.

Figure 4:
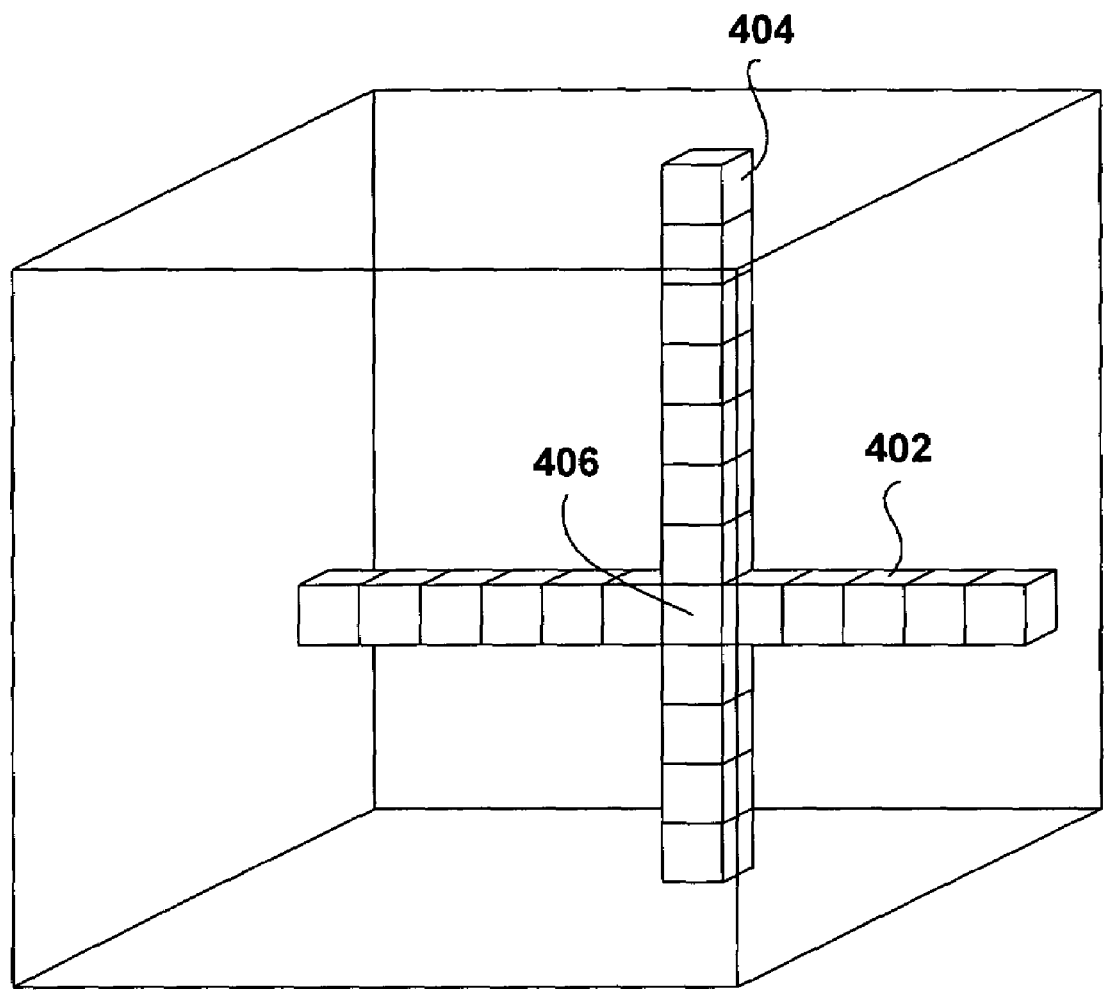
FIG. 4 illustrates a criss-cross of data-storage units within the data-storage volume V.

There are two different types of failure modes within a class of 3-dimensional data-storage media that need to be detected and corrected via an error-control code. A first failure mode is referred to as a "criss-cross error." FIG. 4 illustrates a criss-cross of data-storage units within the data-storage volume V. As shown in FIG. 4, an x-line 402 and a y-line 404 within the 3-dimensional data-storage volume intersect at a common data-storage unit 406. The x-line 402 and y-line 404 occur within a particular xy-slice. A first type of failure mode involves failure of one or more data units within a criss cross such as that shown in FIG. 4. A second type of failure mode for a 3-dimensional data-storage volume V is the failure of an entire xy-slice. In the following discussions, these two different types of failure modes are referred to as "criss-cross failures" and "slice failures," or, alternatively, "Type 1 failures" and "Type 2 failures." Criss-cross failures produce criss-cross, or Type 1, errors, and slice failures produce slice, or Type 2, errors. The described embodiment of the present invention is designed to detect and correct as many as t distinct criss-cross errors and at most a single slice error within a 3-dimensional data-storage volume V, identified as the most probable errors that may occur in a class of 3-dimensional data-storage media.

Mathematical Description of Selected Error-Control Encoding Techniques

The described embodiment of the present invention employs a number of well-known techniques in error-control encoding. An excellent reference for this field is the textbook "Error Control Coding: The Fundamentals and Applications," Lin and Costello, Prentice-Hall, Incorporated, New Jersey, 1983. In this subsection, a brief description of the error-detection and error-correction techniques used in the present invention are provided. Additional details can be obtained from the above-referenced textbook, or from many other textbooks, papers, and journal articles in this field.

In describing error detection and correction, it is useful to describe the data to be transmitted, stored, and retrieved as one or more messages, where a message μ comprises an ordered sequence of symbols, $\mu_i$, that are elements of a field F. A message μ can be expressed as:

$$\mu = (\mu_0, \mu_1, \ldots \mu_{k-1})$$

where $\mu_i \in F$.

The field F is a set that is closed under multiplication and addition, and that includes multiplicative and additive inverses. It is common, in computational error detection and correction, to employ fields comprising a subset of integers with sizes equal to a prime number, with the addition and multiplication operators defined as modulo addition and modulo multiplication. In practice, the binary field is commonly employed. Fields with a size equal to a power of a prime number, most often 2, are quite commonly used. For these fields, addition and multiplication operators are carried out with modulo irreducible polynomials. Commonly, the original message is encoded into an encoded message c that also comprises an ordered sequence of elements of the field F, expressed as follows:

$$c=(c_0, c_1, \ldots c_{n-1})$$

where $c_i \in F$.

The described embodiment of the present invention employs block encoding techniques, in which data is encoded in blocks. In this discussion, a block can be viewed as a message μ comprising a fixed number of symbols k that is encoded into a message c comprising an ordered sequence of n symbols. The encoded message c generally contains a greater number of symbols than the original message μ, and therefore n is greater than k. The r extra symbols in the encoded message, where r equals n–k, are used to carry redundant check information to allow for errors that arise during transmission, storage, and retrieval to be detected with an extremely high probability of detection and, in many cases, corrected.

The encoding of data for transmission, storage, and retrieval, and subsequent decoding of the encoded data, can be notationally described as follows, when no errors arise during the transmission, storage, and retrieval of the data:

$$\mu \to c(s) \to c(r) \to \mu$$

where c(s) is the encoded message prior to transmission, and c(r) is the initially retrieved or received, message. Thus, an initial message μ is encoded to produce encoded message c(s) which is then transmitted, stored, or transmitted and stored, and is then subsequently retrieved or received as initially received message c(r). When not corrupted, the initially received message c(r) is then decoded to produce the original message μ. As indicated above, when no errors arise, the originally encoded message c(s) is equal to the initially received message c(r), and the initially received message c(r) is straightforwardly decoded, without error correction, to the original message μ.

When errors arise during the transmission, storage, or retrieval of an encoded message, message encoding and decoding can be expressed as follows:

$$\mu(s) \to c(s) = c(r) = \mu(r)$$

Thus, as stated above, the final message $\mu_r$ may or may not be equal to the initial message $\mu^s$, depending on the fidelity of the error detection and error correction techniques employed to encode the original message $\mu^s$ and decode or reconstruct the initially received message c(r) to produce the final received message $\mu^r$. Error detection is the process of determining that:

$$c(r) \neq c(s)$$

while error correction is a process that reconstructs the initial, encoded message from a corrupted initially received message:

$$c(r) \to c(s)$$

The encoding process is a process by which messages, symbolized as μ, are transformed into encoded messages c. Alternatively, a messages μ can be considered to be a word comprising an ordered set of symbols from the alphabet consisting of elements of F, and the encoded messages c can be considered to be a codeword also comprising an ordered set of symbols from the alphabet of elements of F. A word μ can be any ordered combination of k symbols selected from the elements of F, while a codeword c is defined as an ordered sequence of n symbols selected from elements of F via the encoding process:

$$\{c: \mu \to c\}.$$

Liner block encoding techniques encode words of length k by considering the word μ to be a vector in a k-dimensional vector space, and multiplying the vector μ by a generator matrix, as follows:

$$c = \mu \cdot G$$

Notationally expanding the symbols in the above equation produces either of the following alternative expressions:

$$(c_0, c_1, \ldots, c_{n-1}) = (\mu_0, \mu_1, \ldots, \mu_{k-1}) \begin{pmatrix} g_{00} & g_{01} & g_{02} & \cdots & g_{0,n-1} \\ \vdots & & \ddots & & \vdots \\ g_{k-1,0} & g_{k-1,1} & g_{k-1,2} & \cdots & g_{k-1,n-1} \end{pmatrix}$$

$$(c_0, c_1, \ldots, c_{n-1}) = (\mu_0, \mu_1, \ldots, \mu_{k-1}) \begin{pmatrix} g_0 \\ g_1 \\ \cdot \\ \cdot \\ \cdot \\ g_{k-1} \end{pmatrix}$$

where $g_i = (g_{i,0}, g_{i,1}, g_{i,2} \cdots g_{i,n-1})$.

The generator matrix G for a linear block code can have the form:

$$G_{k,n} = \begin{pmatrix} p_{0,0} & p_{0,1} & \cdots & p_{0,r-1} & 1 & 0 & 0 & \cdots & 0 \\ p_{1,0} & p_{1,1} & \cdots & p_{1,r-1} & 0 & 1 & 0 & \cdots & 0 \\ \cdot & \cdot & \cdots & & 0 & 0 & 1 & \cdots & 0 \\ \cdot & \cdot & \cdots & & \cdot & \cdot & \cdot & \cdots & \cdot \\ \cdot & \cdot & \cdots & & \cdot & \cdot & \cdot & \cdots & \cdot \\ p_{k-1,0} & p_{k-1,1} & \cdots & p_{k-1,r-1} & 0 & 0 & 0 & \cdots & 1 \end{pmatrix}$$

or, alternatively:

$$G_{k,n} = [P_{k,r} I_{k,k}].$$

Thus, the generator matrix G can be placed into a form of a matrix P augmented with a k by k identity matrix $I_{k,k}$. A code generated by a generator in this form is referred to as a "systematic code." When this generator matrix is applied to a word μ, the resulting codeword c has the form:

$$c=(c_0, c_1, \ldots, c_{r-1}, \mu_0, \mu_1, \ldots, \mu_{k-1})$$

where $C_i = \mu_0 p_{0,i} + \mu_1 p_{1,i}, \ldots, \mu_{k-1} p_{k-1,i})$.

Thus, in a systematic linear block code, the codewords comprise r parity-check symbols $c_i$ followed by the symbols comprising the original word μ. When no errors arise, the original word, or message μ, occurs in clear-text form within, and is easily extracted from, the corresponding codeword. The parity-check symbols turn out to be linear combinations of the symbols of the original message, or word μ.

One form of a second, useful matrix is the parity-check matrix $H_{r,n}$ defined as:

$$H_{r,n} = [I_{r,r} | -P^T]$$

or, equivalently, $$H_{r,n} = \begin{pmatrix} 1 & 0 & 0 & \cdots & 0 & -p_{0,0} & -p_{1,0} & -p_{2,0} & \cdots & -p_{k-1,0} \\ 0 & 1 & 0 & \cdots & 0 & -p_{0,1} & -p_{1,1} & -p_{2,1} & \cdots & -p_{k-1,1} \\ 0 & 0 & 1 & \cdots & 0 & -p_{0,2} & -p_{1,2} & -p_{2,2} & \cdots & -p_{k-1,2} \\ . & . & . & \cdots & . & . & . & \cdots & . \\ 0 & 0 & 0 & \cdots & 1 & -p_{0,r-1} & -p_{1,r-1} & -p_{0,r-1} & \cdots & -p_{k-1,r-1} \end{pmatrix}$$

The parity-check matrix can be used for systematic error detection and error correction. Error detection and correction involves computing a syndrome S from an initially received or retrieved message c(r) as follows:

$$S = (s_0, s_1, \ldots, s_{n-k}) = c(r) \cdot H^T$$

where $H^T$ is the transpose of the parity-check matrix $H_{r,n}$ expressed as:

$$H^T = \begin{pmatrix} 1 & 0 & 0 & \cdots & 0 \\ 0 & 1 & 0 & \cdots & 0 \\ 0 & 0 & 1 & \cdots & 0 \\ . & . & . & \cdots & 1 \\ -p_{0,0} & -p_{0,1} & -p_{0,2} & \cdots & -p_{0,r-1} \\ -p_{1,0} & -p_{0,1} & -p_{0,2} & \cdots & -p_{0,r-1} \\ -p_{2,0} & -p_{0,1} & -p_{0,2} & \cdots & -p_{0,r-1} \\ . & . & . & \cdots & . \\ -p_{k-1,0} & -p_{k-1,1} & -p_{k-1,2} & \cdots & -p_{k-1,r-1} \end{pmatrix}$$

The elements of the syndrome vector S are:

$$s_i = (c(r)_i - c(r)_{r0,i} - c(r)_{r+1} p_{1,i} - c(r)_{r+2} p_{2,i} - \ldots - c(r)_{n-1} p_{k-1,i})$$

The error vector e is defined as the difference between, or the result of vector subtraction of, an initially received message c(r) and an initially prepared and sent codeword c(s) as follows:

$$e \triangleq c(r) - c(s) \Rightarrow c(r) = c(s) + e.$$

The syndrome vector S is related to the error vector as follows:

$$S = c(r) H^T = (c(s) + e) H^T = c(s) H^T + e H^T = e H^T.$$

Error correction involves identifying the errors that have arisen following preparation of the codeword c(s) and up through reception or retrieval of initially received message c(r), and the problem of error correction is the problem of finding an error vector e such that $$eH^T = c(r) H^T.$$

Error correction is then carried out to produce a corrected word ĉ that represents the most probable initially transmitted or stored codeword, by:

$$\hat{c} = c(r) - e$$

Figures 5A, 5B:
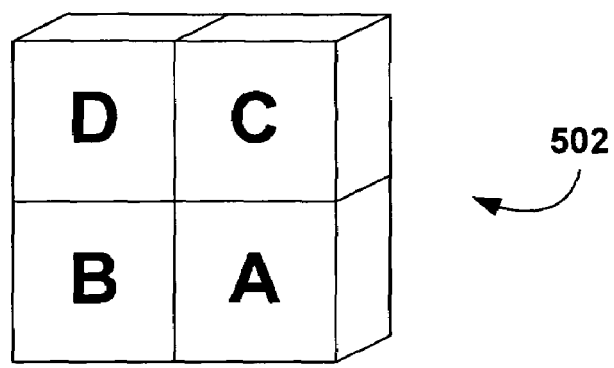
FIG. 5 illustrates a data-storage unit within a data-storage volume on which one embodiment of the present invention is practiced.
Figure 6:
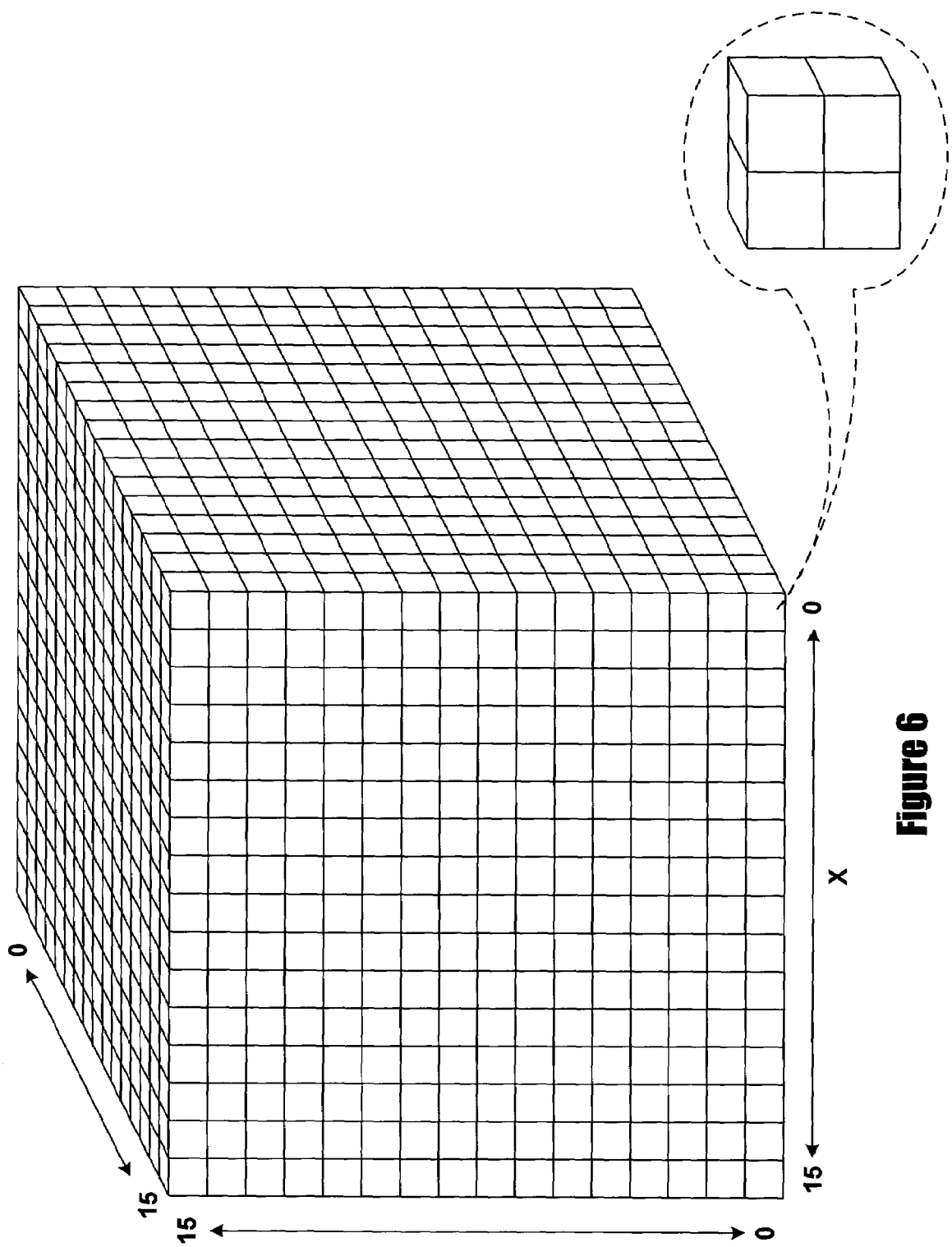
FIG. 6 illustrates a data-storage unit of the 3-dimensional data-storage volume V containing a four-bit element f of the 16-element field F.

Implementation of a Method that Represents One Embodiment of the Present Invention In the described embodiment, each data-storage unit within a 3-dimensional data-storage volume V is an element f of a field F having q elements. In the described embodiment, f can be any of the integer values in the range 0–15, equivalent to the range of integers that can be stored in 4 bits. FIG. 5 illustrates a data-storage unit within a data-storage volume on which one embodiment of the present invention is practiced. FIG. 5A shows that a single data-storage unit 502 can be thought of as comprising four separate bits A–D. FIG. 5B illustrates that each of the possible values of a data-storage unit f can be thought of as a different ordered combination of bit values for bits A–D. In FIG. 5B, the different elements f of field F are labeled with the characters "a"–"p," equivalent to the integers "0"–"15." To be clear, FIG. 6 illustrates that each data-storage unit of the 3-dimensional data-storage volume V is a four-bit-equivalent element f of the 16-element field F.

Figure 7:
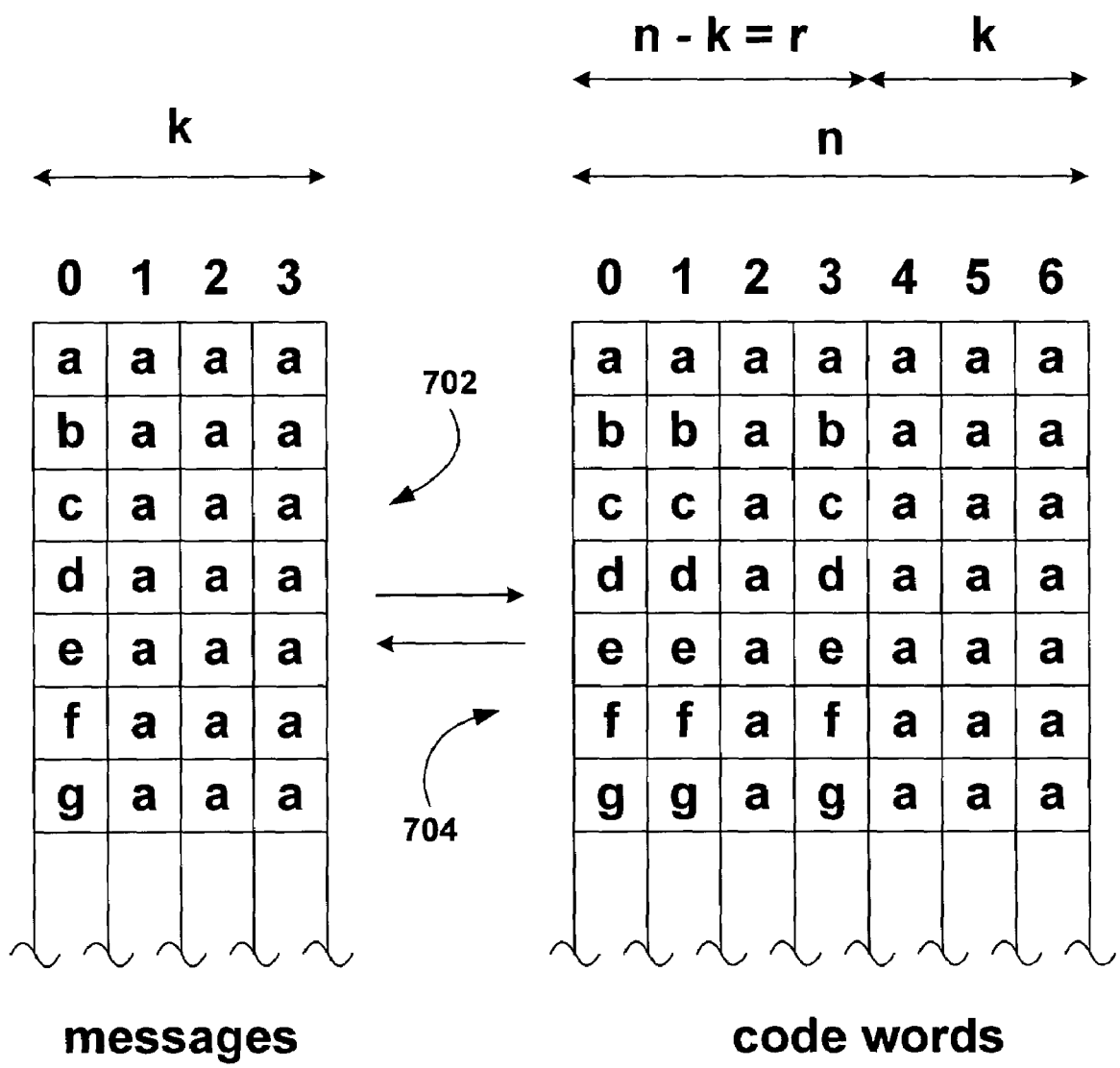
FIG. 7 illustrates the encoding and decoding processes.

As discussed above, encoding a message, or word, using a linear block code involves using the message, or word, to produce a codeword that includes the message, or word, in clear-text form, along with additional parity-check symbols. FIG. 7 illustrates the encoding and decoding processes. As shown in FIG. 7, each message, or word, comprises an ordered sequence of k symbols. Thus, the left-hand array 702 in FIG. 7 (only a portion of which is shown in FIG. 7) enumerates the various different $q^k$ different valid messages, or words, of length k. In array 702, each row represents a distinct message, or word. In the example shown in FIG. 7, each word, or message, has a length k=4. The messages, or words, are encoded into codewords contained in the right-hand array 704 in FIG. 7. In FIG. 7, each row of the right-hand array 704 is a distinct codeword that corresponds to the message in the corresponding row of the left-hand array. As can be seen in FIG. 7, the final four symbols within each codeword correspond to the clear-text message from which the codeword was produced. Thus, for any particular encoding/decoding linear-block scheme, the parameters k, n, and r refer to the length of the messages, or words, the length of the encoded messages or codewords, and the minimum Hamming distance of the code, respectively. Below, a particular systematic linear block code is referred to by the notation "C[n, k, r]" where C is the name of the code, n is the length of a codeword, k is the length of the word from which a codeword of length n is generated, and r is the minimum Hamming distance of the code.

One embodiment of the present invention is described below with concurrent reference to both a pseudocode implementation and to a large number of illustrations. The pseudocode implementation is written in a high-level pseudocode language using certain of the notational conventions and elements of the programming language C++, but also employing a higher-level mathematical notation suitable for concisely and clearly specifying the operations of a method that represents one embodiment of the present invention. Please note that local variables and scoping rules for subroutines are not employed in the following pseudocode, in the interest of brevity. In an actual implementation in a normal programming language, such as C++, normal programming conventions, such as eliminating global variables and controlling exchange of data between routines through well-structured interfaces would be expected to be followed.

First, a routine "encode" is provided. The routine "encode" starts with the following declarations:

| ROUTINE ENCODE | | |
|---|---|---|
| 1 | Declarations: | |
| 2 | | |
| 3 | F | field of q elements |
| 4 | V, V' | volumes of cells of dimensions $n_x$ by $n_y$ by $n_z$, each cell |
| 5 | | containing an element of field F |
| 6 | $C_x$ | systematic linear code $C_x[n_x, k_x, 3]$ with $r_x = n_x - k_x$ |
| 7 | $C_y$ | systematic linear code $C_y[n_y, k_y, 3]$ with $r_y = n_y - k_y$ |
| 8 | $C_xC_y$ | systematic product code $C_xC_y$ $[n_xn_y, k_xk_y, 9]$ with $r_{xy} = n_xn_y - k_xk_y$ |
| 9 | $C_z$ | systematic linear code $C_z[n_z, k_z, 2t+1]$ with $r_z = n_z - k_z$ |
| 10 | $C'_z$ | systematic linear code $C'_z$ $[n_z, k'_z, t+1]$ with $r'_z = n_z - k'_z$ |
| 11 | v0 | vector of elements of Field F having length $n_z$ |
| 12 | v1 | vector of elements of Field F having length $k'_z$ |
| 13 | v2, v3 | vectors of elements of Field F having length $k_z$ |
| 14 | sum | variable with a value of an element of field F |
| 15 | x, y, z, i integers | |
| 16 | getInfo(n) | gets n information elements of field F from an input stream |

The routine "encode" includes a method for encoding data into a 3-dimensional data-storage volume comprising a number of data-storage units. The method includes the steps of: receiving a sequence of data; and encoding the sequence of data using a linear product code to encode data into code arrays of data values, and using two linear block codes to encode data into vectors of data values.

Figure 8:
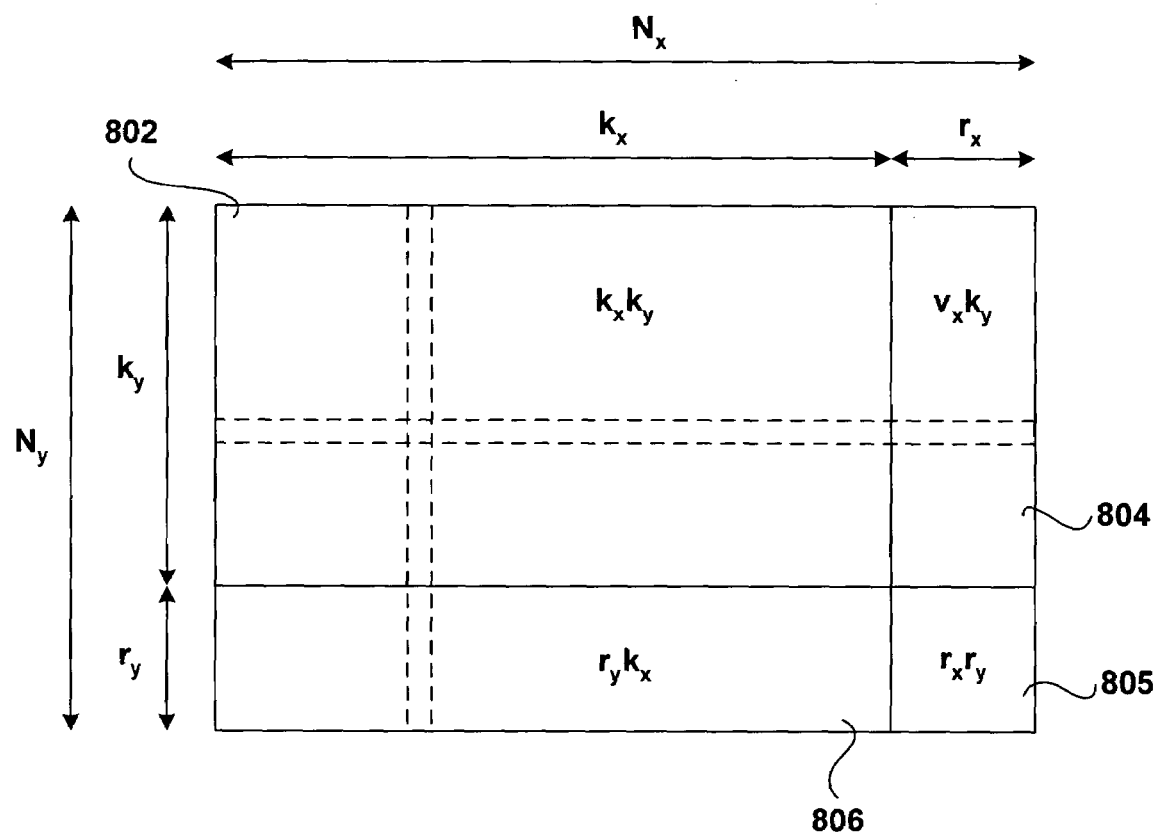
FIG. 8 illustrates the layout of a code array produced by a product code.

The routine "encode" receives and encodes words comprising elements q, of the field F, as declared above on line 3. Two different 3-dimensional volumes of data-storage units are employed, volumes V and V', declared above on line 4. The described embodiment employs four different systematic linear block codes $C_x$, $C_y$, $C_z$, and $C'_z$ as well as a product code $C_xC_y$, declared above on lines 6–10. The parameters k, n, and r for each of the four different systematic linear-block codes and product code are specified in the declarations. The linear-block code $C_xC_y$ is a product code. A product code is a combination of two simple systematic linear codes that produces a 2-dimensional code array, rather than a 1-dimensional codeword. FIG. 8 illustrates the layout of a code array produced by a product code. As shown in FIG. 8, the code array comprises $k_xk_y$ clear-text symbols within a clear-text region of the code array 802 along with three parity-check-symbol regions 804–806, with dimensions and orientations as shown in FIG. 8. Code arrays are stored as planes within a 3-dimensional data-storage volume. Product codes are well known in the error-control-coding field, and are described in the above-referenced text "Error Control Coding: Fundamentals and Applications."

The routine "encode" employs four different vectors of elements of field F, v0, v1, v2, and v3, declared above on lines 11–13, that have the lengths specified in the declarations. The variable "sum," declared above on line 14, stores an element of the field F that represents the sum of two elements of the field F. The routine "encode" employs four different integer variables "x," "y," "z," and "i," declared above on line 15. Finally, the routine "encode" employs the function "getInfo" that obtains a specified number of information elements of the field F from an input stream for encoding. The routine "encode" calls the function "getInfo," declared above on line 16, to obtain each successive set of information elements to be encoded into the 3-dimensional data-storage volume V.

As shown below, the routine "encode" employs the following notational conventions:

| | | |
|---|---|---|
| 1 | Notational Conventions: | |
| 2 | | |
| 3 | m = C(k) | applies code C to a sequence of elements |
| 4 | | of field F of length k to produce |
| 5 | | a codeword m |
| 6 | m = $C_1C_2(k_1k_2)$ | applies product code $C_1C_2$ to a |
| 7 | | sequence of elements of field F of length |
| 8 | | $k_1k_2$ to produce a code array m of |
| | | dimensions $n_1$, $n_2$ |

The routine "encode" employs four subroutines, which will be described separately below. The first subroutine SubtractZLineFromInfoVector is provided below:

| | |
|---|---|
| 1 | Routine SubtractZLineFromInfoVector(x,y) |
| 2 | |
| 3 | /* computes $\mu_{i,j} - <V_{i,j}>_{k'_z}$ where $\mu_{i,j}$ is a vector of information elements |
| 4 | of field F and $<V_{i,j}>_{k'_z}$ is the high-order $k'_z$ elements of a z-line |
| 5 | vector $V_{i,j}$ of volume V |
| 6 | */ |
| 7 | |
| 8 | v1 = getInfo($k'_z$); |
| 9 | for (i = 0, z = $n_z - k'_z$ ; z < $n_z$; i++, z++) |
| 10 | { |
| 11 | v1[i] = v1[i] − $V_{xy}$[z]; |
| 12 | } |

SubractZLineFromInfo Vector fetches $k'_z$ information units from the information-element stream via the function "getInfo" and subtracts from them the current contents of a z-line from a 3-dimensional data-storage volume V. The results are left in the vector v1.

The subroutine ComputeAZProjectionVector is next provided:

```
1   Routine ComputeXZProjectionVector(y)
2
3   v0 = 0;
4   for (x = 1; x < n_x; x++)
5     for (z = 0; z < n_z; z++)
6     {
7        v0[z] = v0[z] + V'_xy [z];
8     }
```

ComputeXZProjectionVector projects the contents of an xz-slice, or xz-plane, within a 3-dimensional data-storage volume V', into the vector "v0." The subroutine ComputeYZProjectionVector computes a projection vector from yz-slices within a 3-dimensional data-storage volume V' in a fashion similar to that of the above routine:

```
1   Routine ComputeYZProjectionVector(x)
2
3   v0 = 0;
4   for (y = 1; y < n_y; y++)
5     for (z = 0; z < n_z; z++)
6     {
7        v0[z] = v0[z] + V'_xy [z];
8     }
```

The subroutine ComputeProjectionVolumeDifference is next provided:

```
1   Routine ComputeProjectionVolumeDifference(x, y)
2
3   for (z = n_z - k_z, i = 0; z < n_z; z++, i++)
4   {
5      v2[i] = v0[z] + V_xy [z];
6   }
```

This subroutine adds the contents of a z-line from a 3-dimensional data-storage volume V to the contents of a vector "v0," and places the sum into vector "v2."

Finally, the main portion of the routine "encode" is provided:

```
1   Main (Encode):
2
3   /* encodes k_x k_y(n_z - 1) + k'_z ( n_x n_y - n_x - n_y + 1 - k_x k_y) +
        k_z(n_x + n_y + 1)
4        information elements of field F into a storage
         volume V of elements
5        of field F having dimensions n_x, n_y, n_z
6   */
7   for (z = 1; z < n_z; z++)
8   {
9      V_z = C_x C_y (getInfo(k_x k_y));
10  }
11  for (x = 0; x < n_x; x++)
12    for (y = 0; y < n_y; y++)
13    {
14       sum = 0;
15       for (z = 1; z < n_z; z++)
16       {
17          sum += V_xy[z];
18       }
19       V_xy[z] = -sum;
20    }
21  for (x = 1; x < r_x; x++)
22    for (y = 1; y = n_y; y++)
23    {
24       SubtractZLineFromInfoVector(x,y);
25       V'_xy = C'_z (v1);
26    }
27  for (y = 1; y = r_y; y++)
28    for (x = r_x; x < n_x; x++)
29    {
30       SubtractZLineFromInfoVector(x, y);
31       V'_xy = C'_z (v1);
32    }
33  for (y = 1; y < n_y; y++)
34  {
35     v3 = getInfo(k_z);
36     ComputeXZProjectionVector(y);
37     ComputeProjectionVolumeDifference(0, y);
38     V'_0,y = C_z(v3 - v2) - v0;
39  }
40  for (x = 0; x < n_x; x++)
41  {
42     v3 = getInfo(k_z);
43     ComputeYZProjectionVector(x);
44     ComputeProjectionVolumeDifference(x, 0);
45     V'_x,0 = C_z(v3 - v2) - v0;
46  }
47  for (x = 0; x < n_x; x++)
48    for (y = 0; y < n_y; y++)
49    {
50       V_xy = V_xy + V'_xy;
51    }
```

This routine basically obtains a number of information elements from an input stream, the number described above on line 3 in a comment, and encodes these information elements into a 3-dimensional data-storage volume V. At the conclusion of the encoding, these information elements appear in clear-text form within the data-storage volume V, along with a relatively small number of parity-check symbols.

Figure 9:
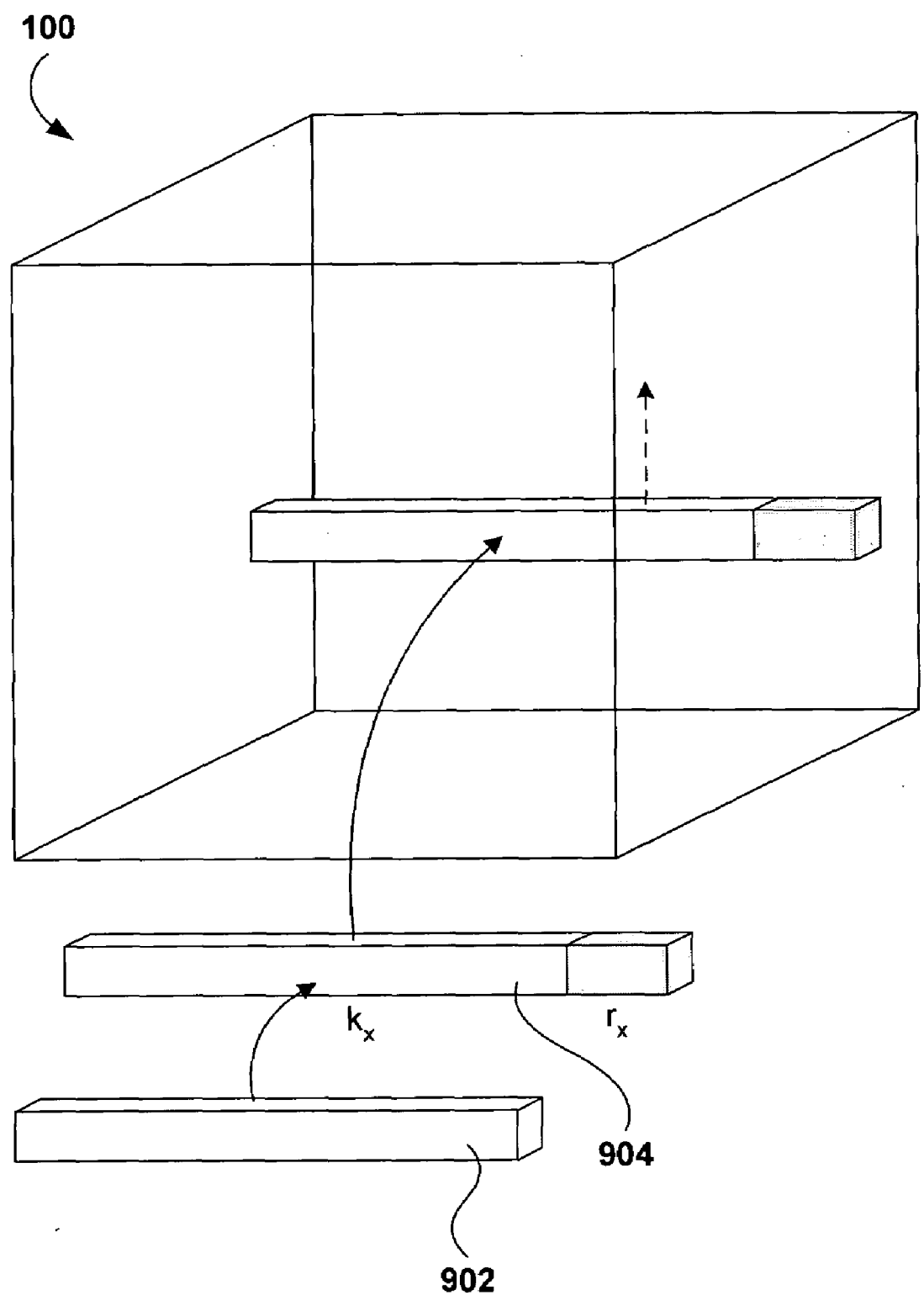
FIGS. 9–13 illustrate the filling of a 3-dimensional data-storage volume V with $n_z-1$ xy-slices.
Figure 10:
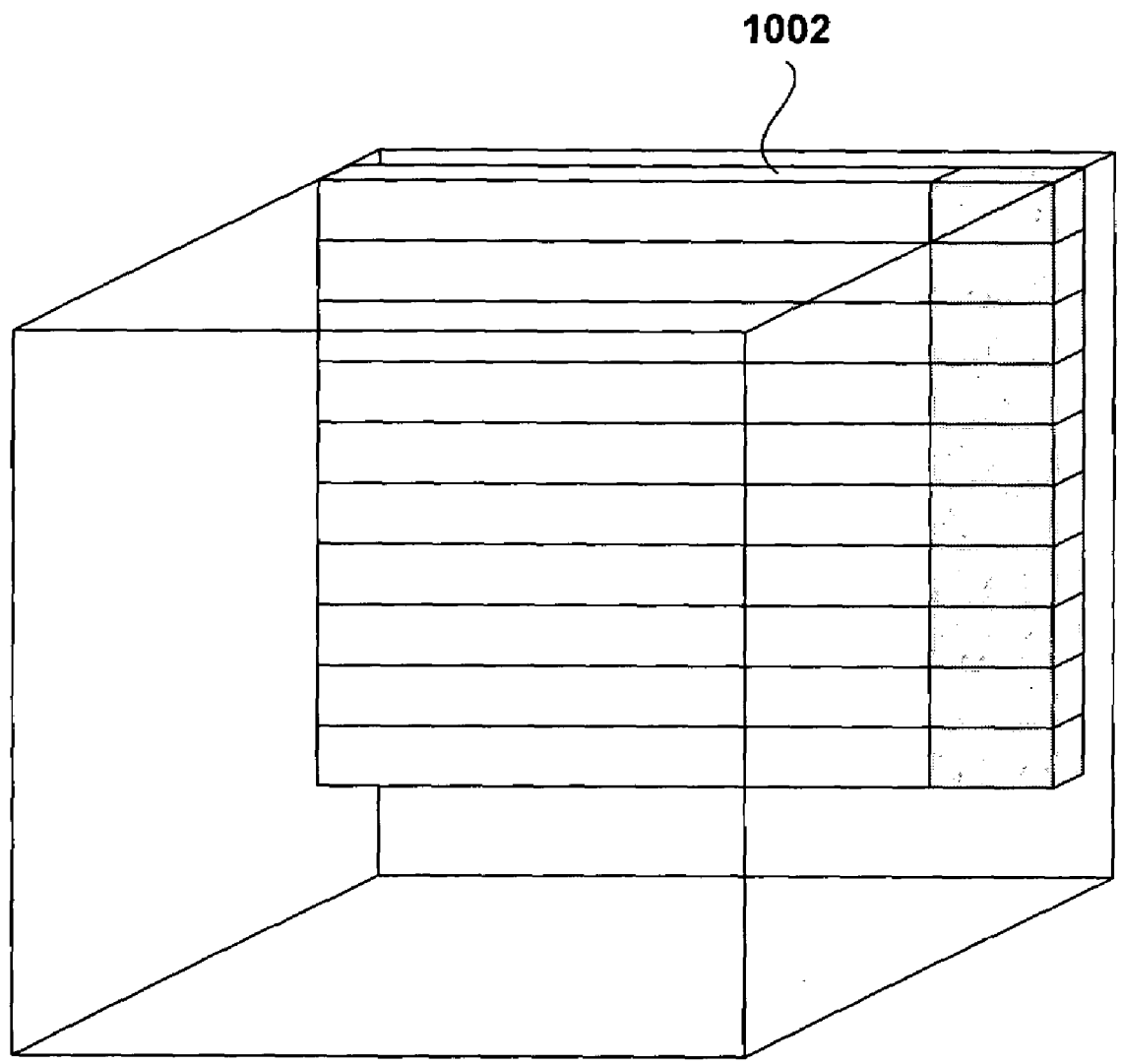
Figure 11:
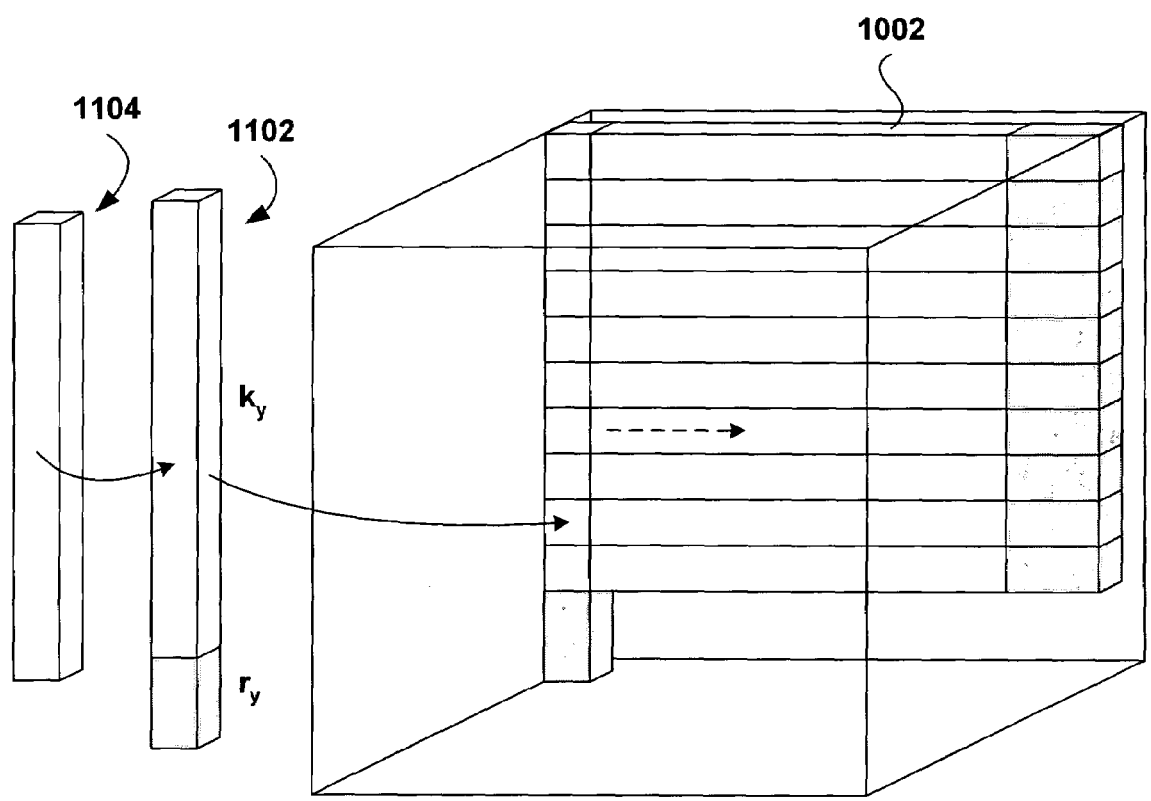
Figure 12:
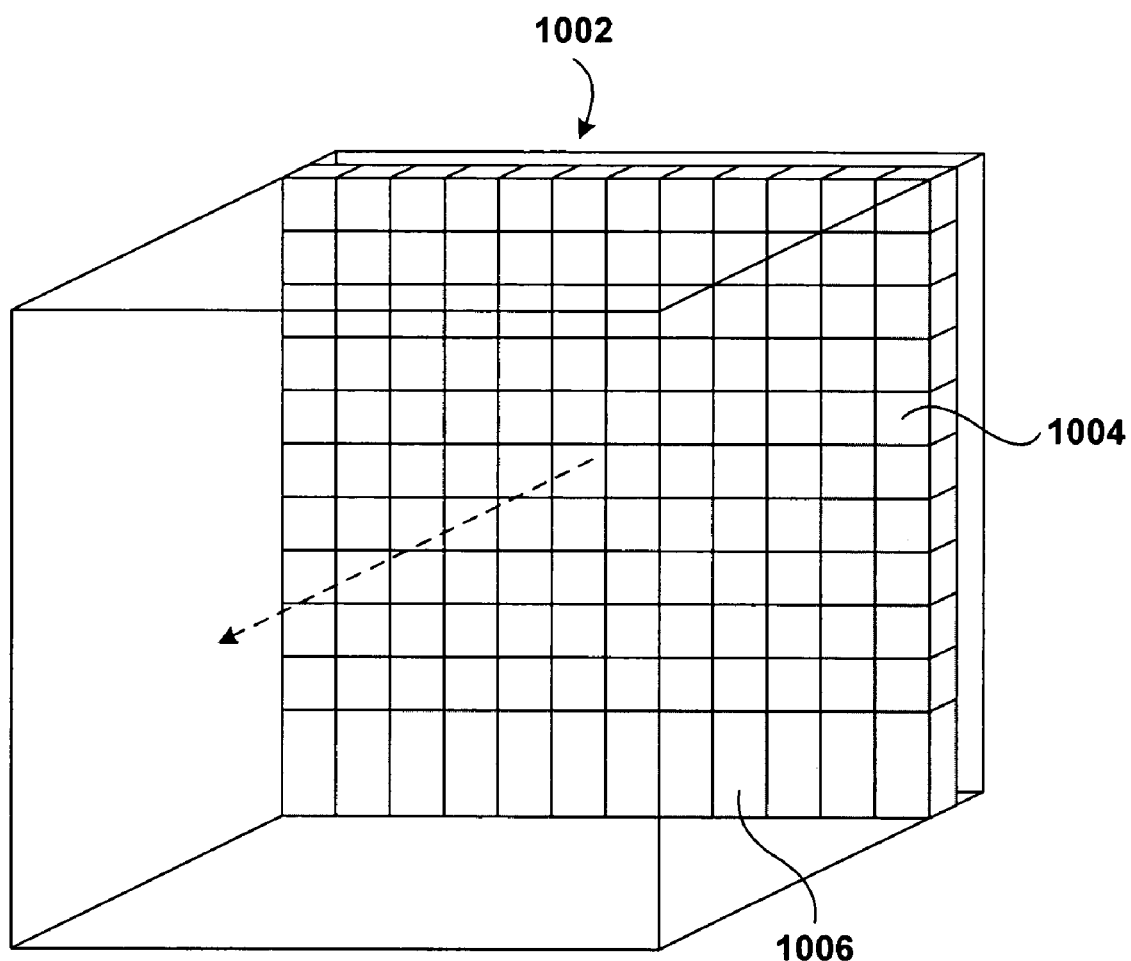
Figure 13:
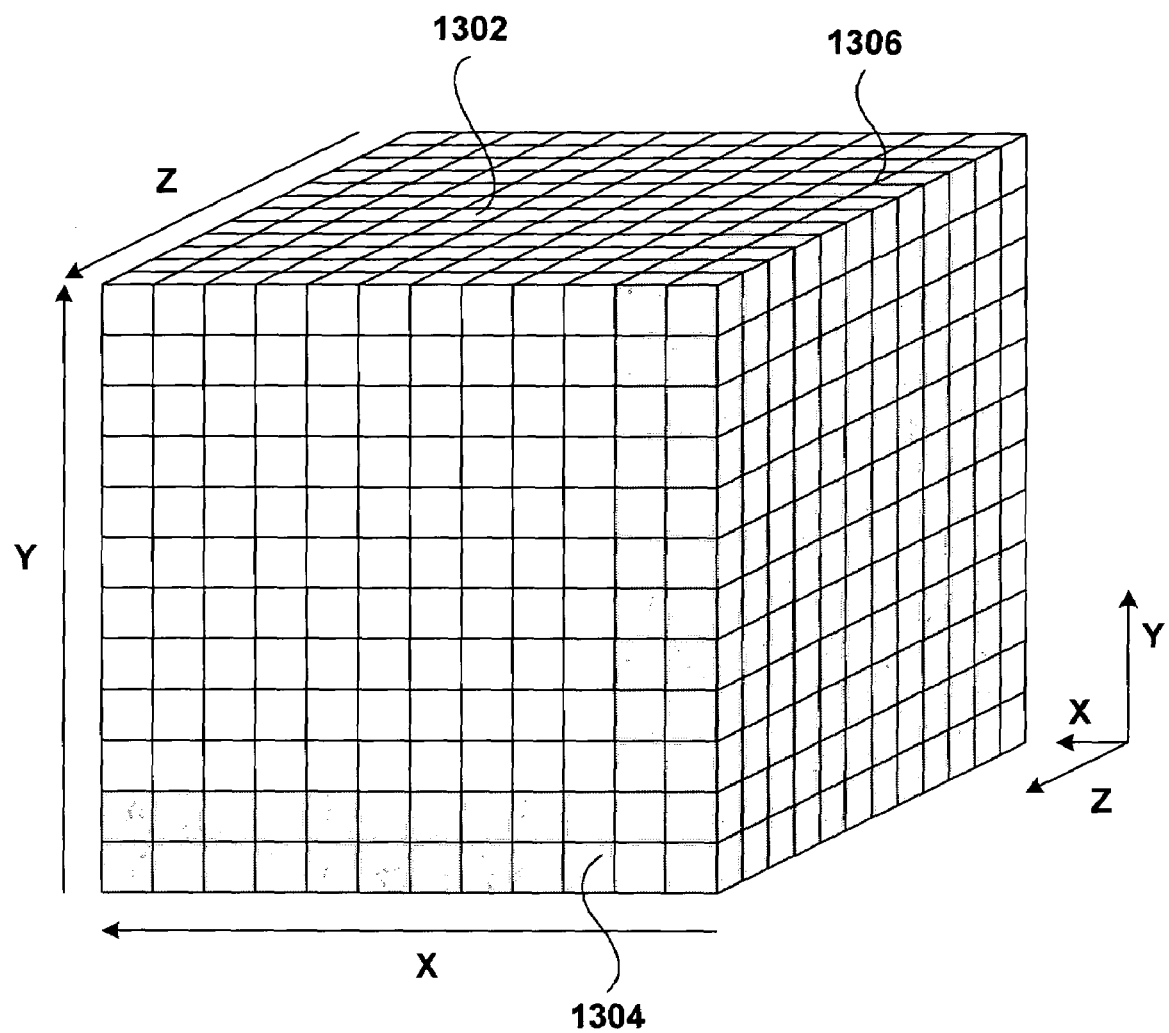

First, in the for-loop of lines 7–10, the routine "encode" fetches lengths of $k_x k_y$ information elements from the input stream and encodes them into code arrays via the product code $C_x C_y$ to form $n_z-1$ xy-slices within the 3-dimensional data-storage volume V. FIGS. 9–13 illustrate the filling of the 3-dimensional data-storage volume V with $n_z-1$ xy-slices by the for-loop of lines 7–10. Note that the xy-slice with z-axis coordinate "0" is not entered into the 3-dimensional data-storage volume V in this initial step. As shown in FIG. 9, the parity-check symbols for rows of the first xy-slice with z coordinate 1 can be thought of as being filled by applying the parity check rules for $C_x$ to rows of information symbols 902 to produce encoded rows of length $n_x$ 904, and entering the encoded rows, such as encoded row 904, into the 3-dimensional data-storage volume V 100. As shown in FIG. 10, a particular xy-slice 1002 can be thought of as, in part, built from $k_y$ rows produced by applying systematic linear-block code $C_x$ to obtain encoded rows of length $n_x$. As shown in FIG. 11, a particular xy-slice is further composed of columns 1102 obtained by applying the systematic linear-block code $C_y$ to $k_y$ information elements 1104. The contents of the first $k_x$ information units in each row and the first $k_y$ information units in each column are clear-text information symbols obtained from the information input stream. As shown in FIG. 12, the final xy-slice 1002 is a code array representing the product of application of the product code $C_xC_y$ to $k_xk_y$ information elements. Note that the xy-slice 1002 includes $k_xk_y$ clear-text information units (unshaded in FIG. 12), along with vertical and horizontal regions of parity-check symbols (shaded in FIG. 12) 1004 and 1006, respectively. As shown in FIG. 13, the for-loop of lines 7–10 runs from z coordinate 1 to z coordinate $n_z$–1 to produce a volume of clear-text information elements 1302 above and to the left of volumes of parity-check elements 1304 and 1306 (the parity-check elements are shaded). Note that the product code could be used to fill the 3-dimensional data-storage volume V, and provide error detection and correction capabilities commensurate with the number of parity-check symbols $n_zr_xr_y$. However, as will be seen below, such a technique uses a much larger number of parity-check symbols than required to detect and correct errors resulting from the two types of probable failure modes, described above. Thus, the described embodiment of the present invention is employed to use a greater proportion of the data-storage units within a 3-dimensional data-storage volume V for storing clear-text information elements, and to correspondingly decrease the proportion of parity-check information elements within the 3-dimensional data-storage volume V.

Figure 14:
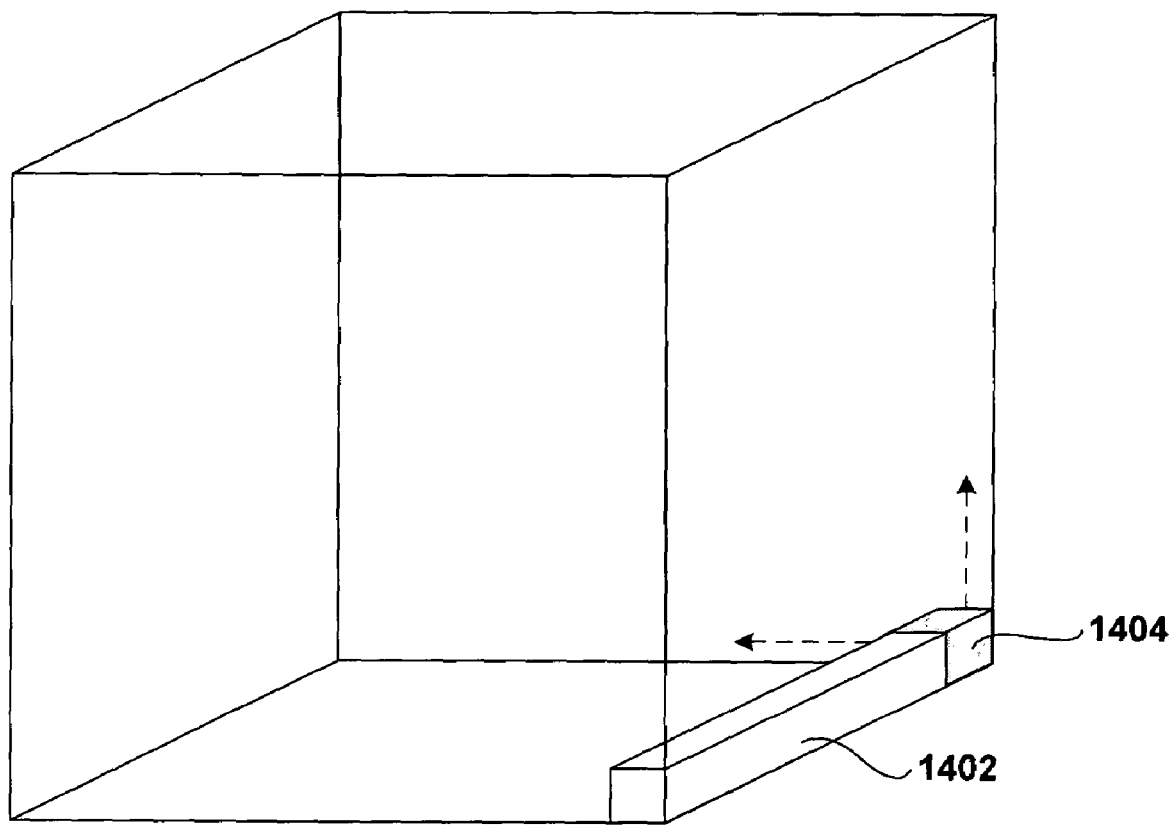
FIGS. 14–15 illustrate storage of additive inverses of the sums of z-line cells into the xy-slice of volume V with z-coordinate "0."
Figure 15:
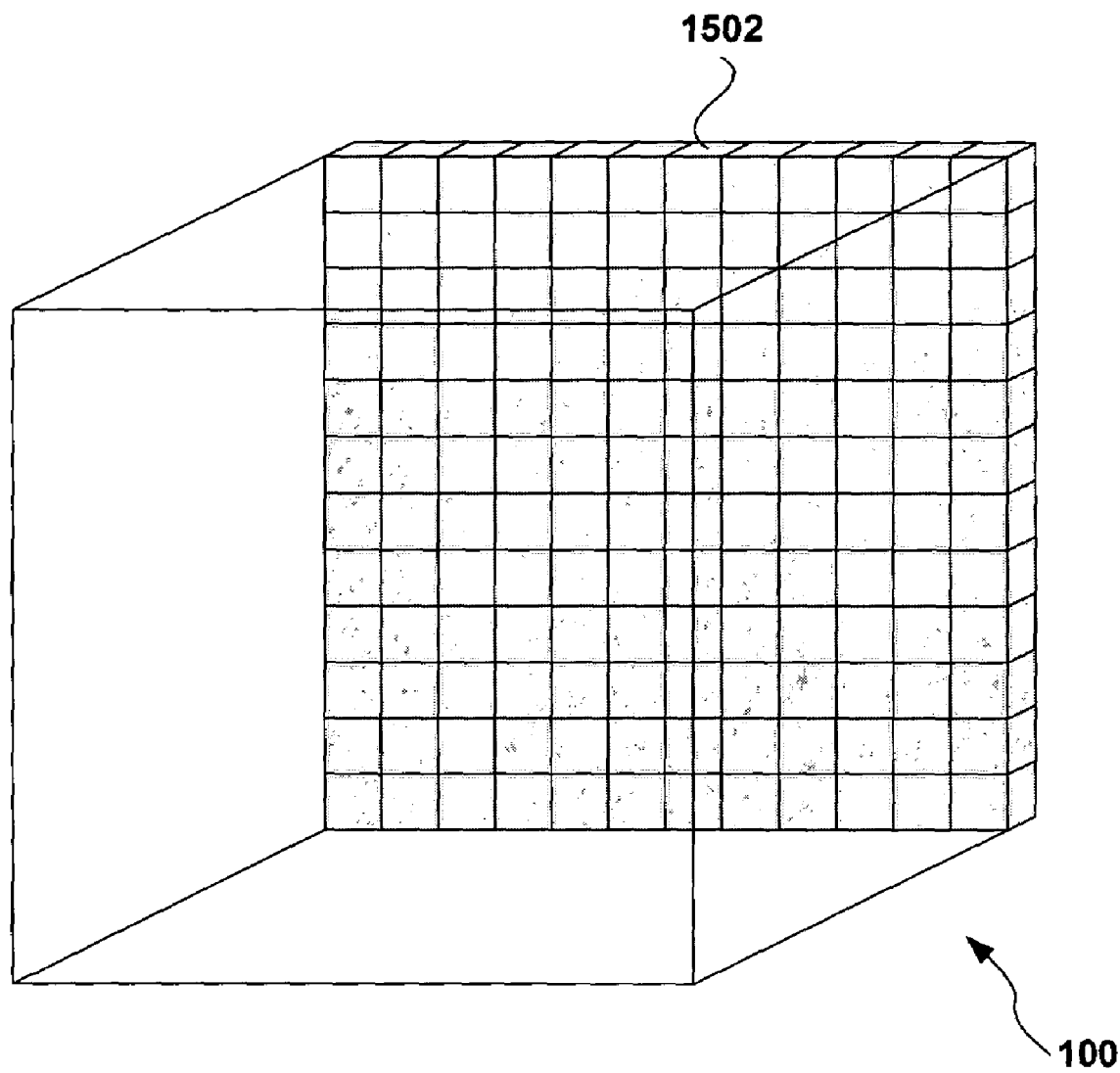
Figure 16:
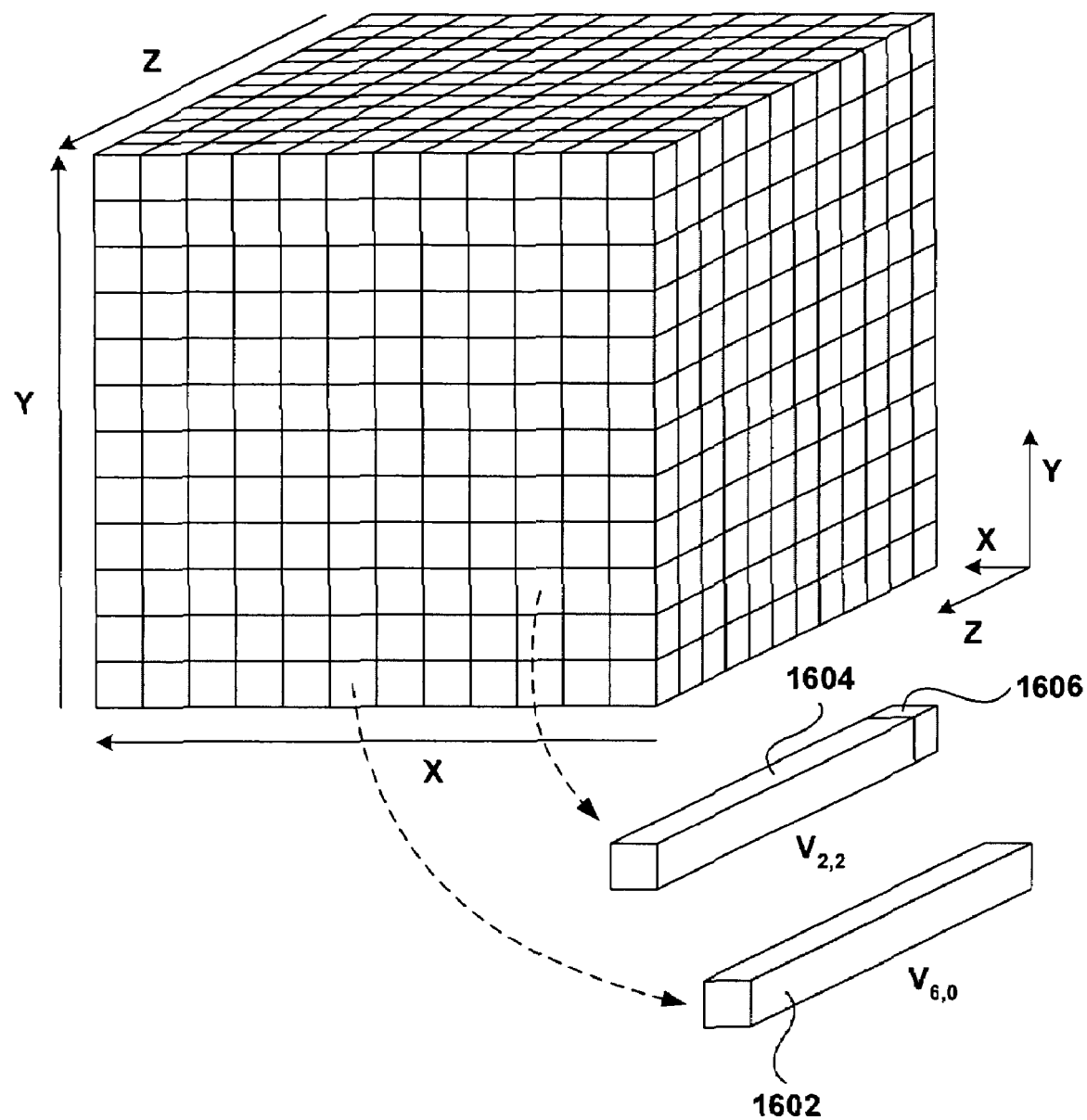
FIG. 16 illustrates the contents of the 3-dimensional data-storage volume V following execution of nested for-loops of lines 11–24 in a pseudocode implementation of an embodiment of the present invention.

Next, in the nested for-loops of lines 11–20, the routine "encode" computes the sum of the data-storage units in each z-line of the 3-dimensional data-storage volume V, shown in FIG. 13, and stores the additive inverse of that sum into the first element of each z-line within the 3-dimensional data-storage volume V. This process is illustrated in FIGS. 14–15. As shown in FIG. 14, a first z-line 1402 with x and y coordinates (0,0) is considered in the first iteration of the nested for-loops of lines 11–24. The data units within z-line 1402 are summed, using modulo addition, and the additive inverse of that sum is stored into the first data-storage unit 1404 of the z-line. As a result of execution of the nested for-loops of lines 11–20, the first xy-slice of the 3-dimensional data-storage volume V 100 is filled with the additive inverses of the sums of the z-lines. FIG. 16 illustrates the contents of the 3-dimensional data-storage volume V following execution of the nested for-loops of lines 11–20. Each of the z-lines within the parity-check regions of the volume at the bottom and right-hand sides of the volume, such as z-line 1602, contain only parity-check symbols. Each of the internal z-lines within the mostly clear-text information-symbol portion of the volume, such as z-line 1604, contain clear-text information symbols in all but the first data-storage unit of the z-line. The first data-storage unit, such as data-storage unit 1606 of z-line 1604, contains the additive inverse of the sum of the information elements stored in the remaining data-storage units of the z-line.

Figure 17:
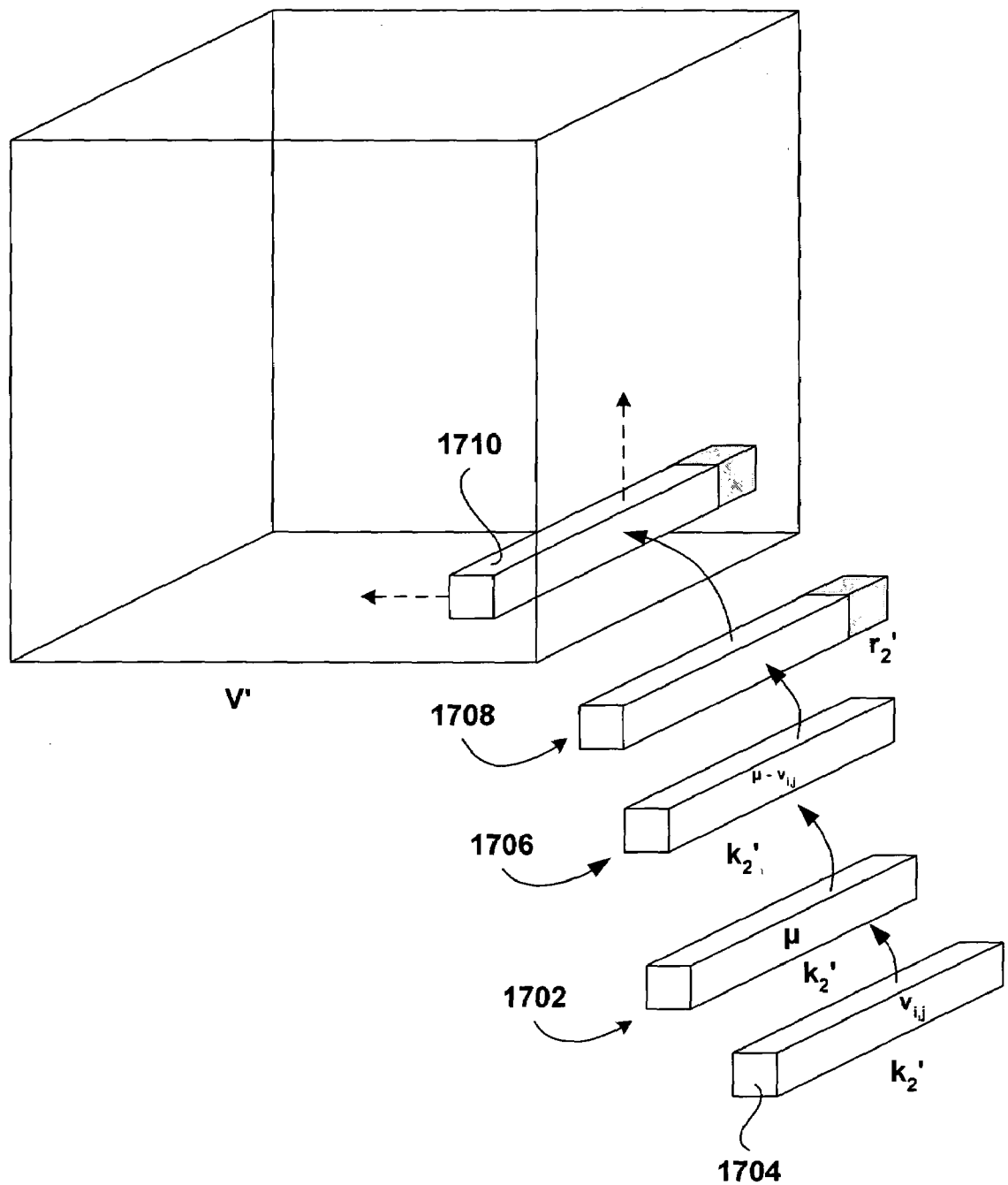
FIGS. 17–18 illustrate filling of partial yz-slices and xz-slices of volume V'.
Figure 18:
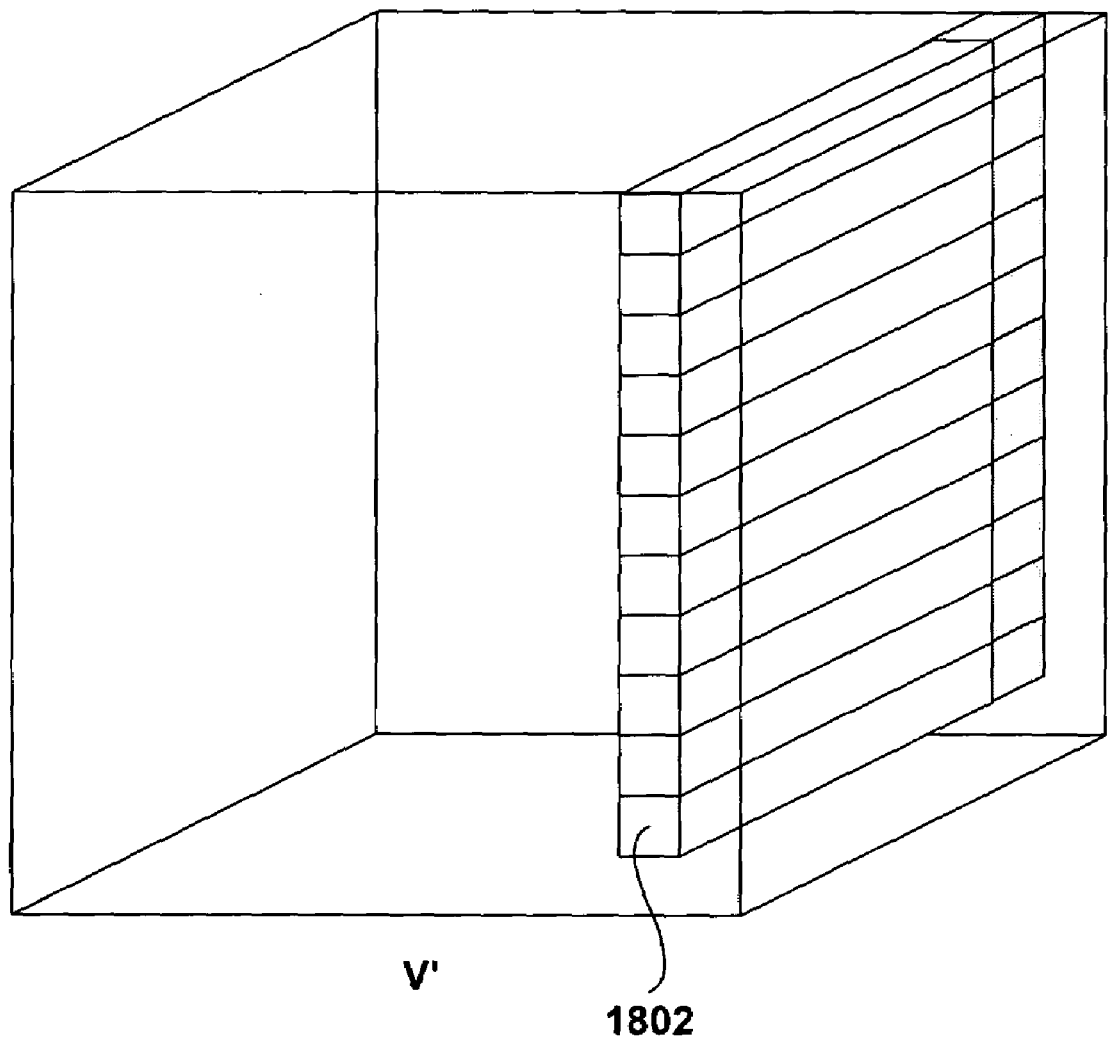
Figure 19:
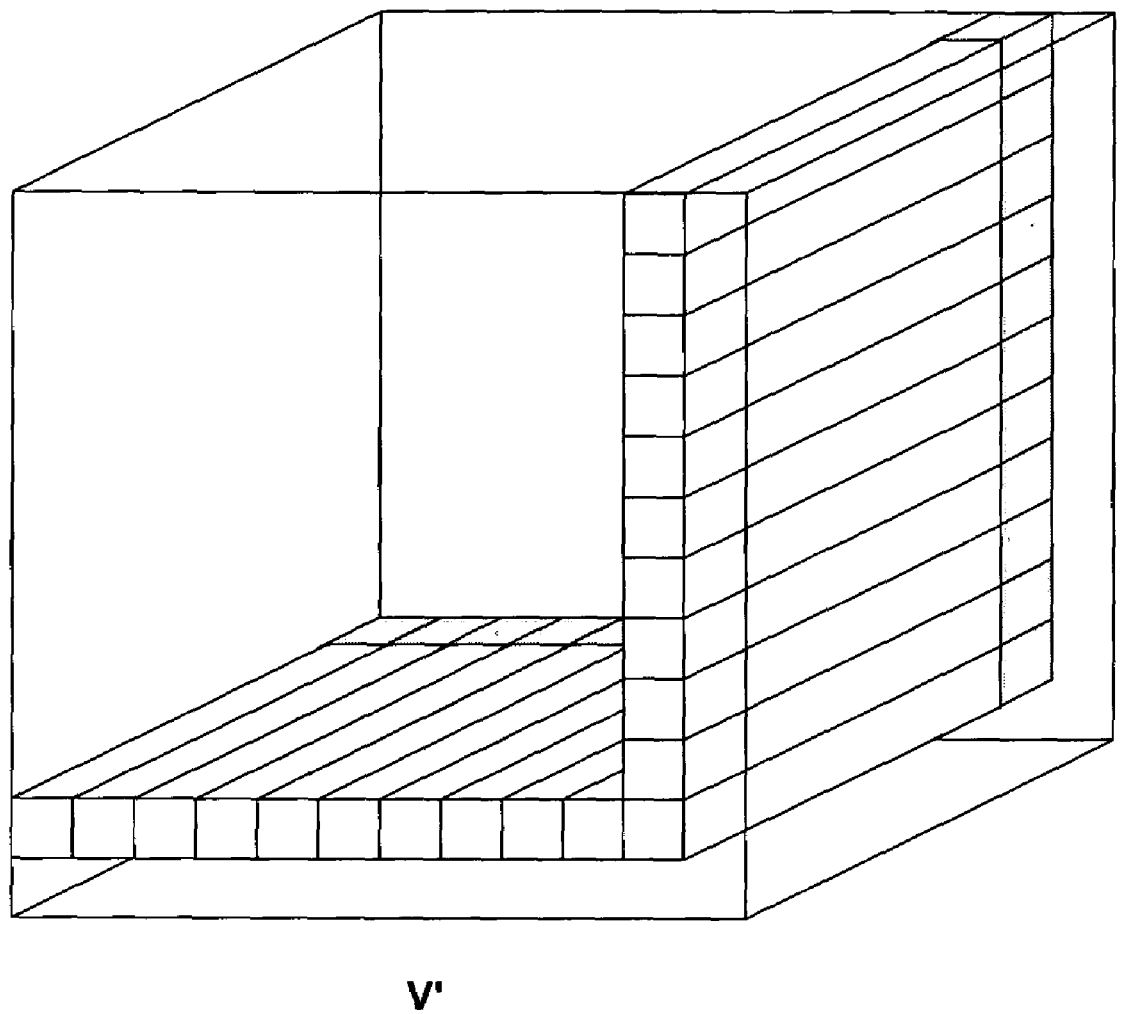
FIG. 19 shows the results of execution of the nested for-loops of lines 25–30 and 31–36 of the routine "encode."

Next, in the nested for-loops of lines 21–26, the routine "encode" encodes additional information symbols into a second 3-dimensional data-storage volume V'. The additional information symbols are encoded into z-lines that form a number of vertical yz-slices at the right-hand side of 3-dimensional data-storage volume V'. As can be seen in the for-loop arguments, in the nested for-loops of lines 21–26, a number of vertical yz-slices equal to one less than $r_x$, the number of parity-check symbols produced by systematic linear-block code $C_x$, are produced starting from x-axis coordinate 1 up to x-axis coordinate $r_x$–1. The encoding involves subtracting the current contents of 3-dimensional data-storage volume V for a particular z-line from a vector containing newly obtained information elements, and encoding the resulting vector using the systematic linear-block code $C'_z$, on line 29, to produce a codeword stored as a z-line within the 3-dimensional data-storage volume V'. This process is illustrated in FIGS. 17-18. As shown in FIG. 17, for the first z-line added to 3-dimensional data-storage volume V', $k'_z$ information elements are obtained from the input stream and loaded into vector μ 1702. The contents of the corresponding z-line from 3-dimensional data-storage volume V 1704 are subtracted from the vector μ 1702, and the results placed into the vector 1706. This vector is then encoded, using systematic linear-block code $C'_z$, on line 29 of the routine "encode," to produce the codeword, or vector, 1708. This codeword 1708 is then stored into the 3-dimensional data-storage volume V' 1710 at the xy coordinates corresponding to the x,y coordinates of the z-line of 3-dimensional data-storage volume V 1704 subtracted from the obtained-information-elements vector μ 1702. As a result of the execution of the for-loop of lines 21–26, a number of vertical yz-slices, such as yz-slice 1802, are entered into 3-dimensional data-storage volume V'. Although only one yz-slice is shown in FIG. 18, the nested for-loops of lines 21–26 generally place $r_x$–1 such yz-slices into 3-dimensional data-storage volume V'. The nested for-loops of lines 27–32 insert, in similar fashion, a horizontal block of z-lines encoded by the systematic linear-block code "$C'_z$" into the data-storage volume V'. The result of execution of the nested for-loops of lines 21–26 and lines 27–32 is a mirror-image-L-shaped region of z-lines within the data-storage volume V'. FIG. 19 shows the results of execution of the nested for-loops of lines 21–26 and 27–32 of the routine "encode." Although, in FIG. 19, only a single yz-slice and a single xz-slice are shown, as described above, the nested for-loops of lines 21–26 and lines 27–32 generally produce a vertical and horizontal block of z-lines within the 3-dimensional data-storage volume V'. The vertical yz-slices start with x-axis coordinate 1 and continue leftward through x-axis coordinate $r_x$–1. The horizontal xz-slices start with y-axis coordinate 1 and continue upward through y-axis coordinate $r_y$–1. Note that the right-most yz-slice and the bottom-most xz-slice of 3-dimensional data-storage volume V' are not yet filled following execution of the nested for-loops of lines 27–32.

Figure 20:
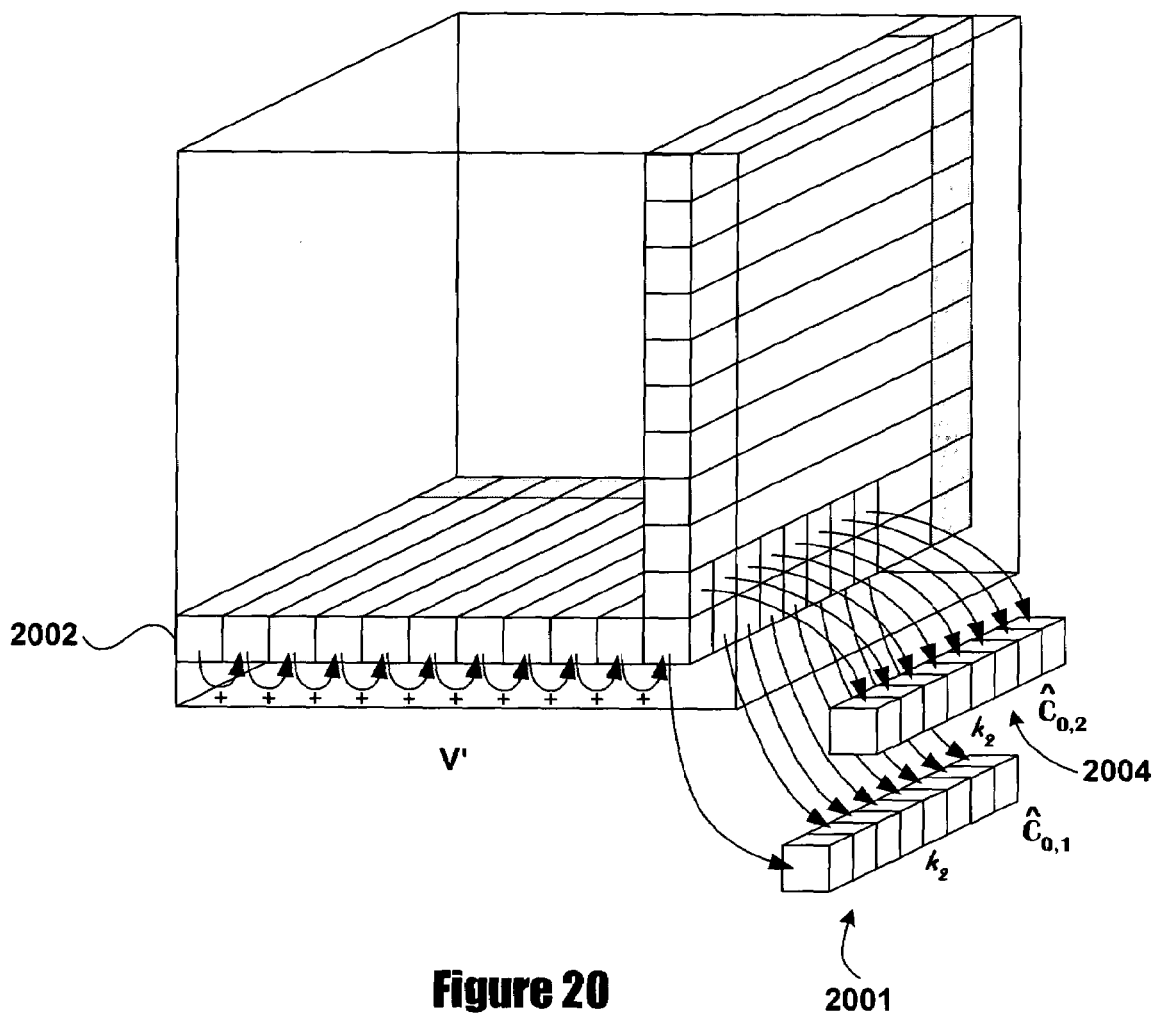
FIG. 20 illustrates calculation of a projection vector.
Figure 21:
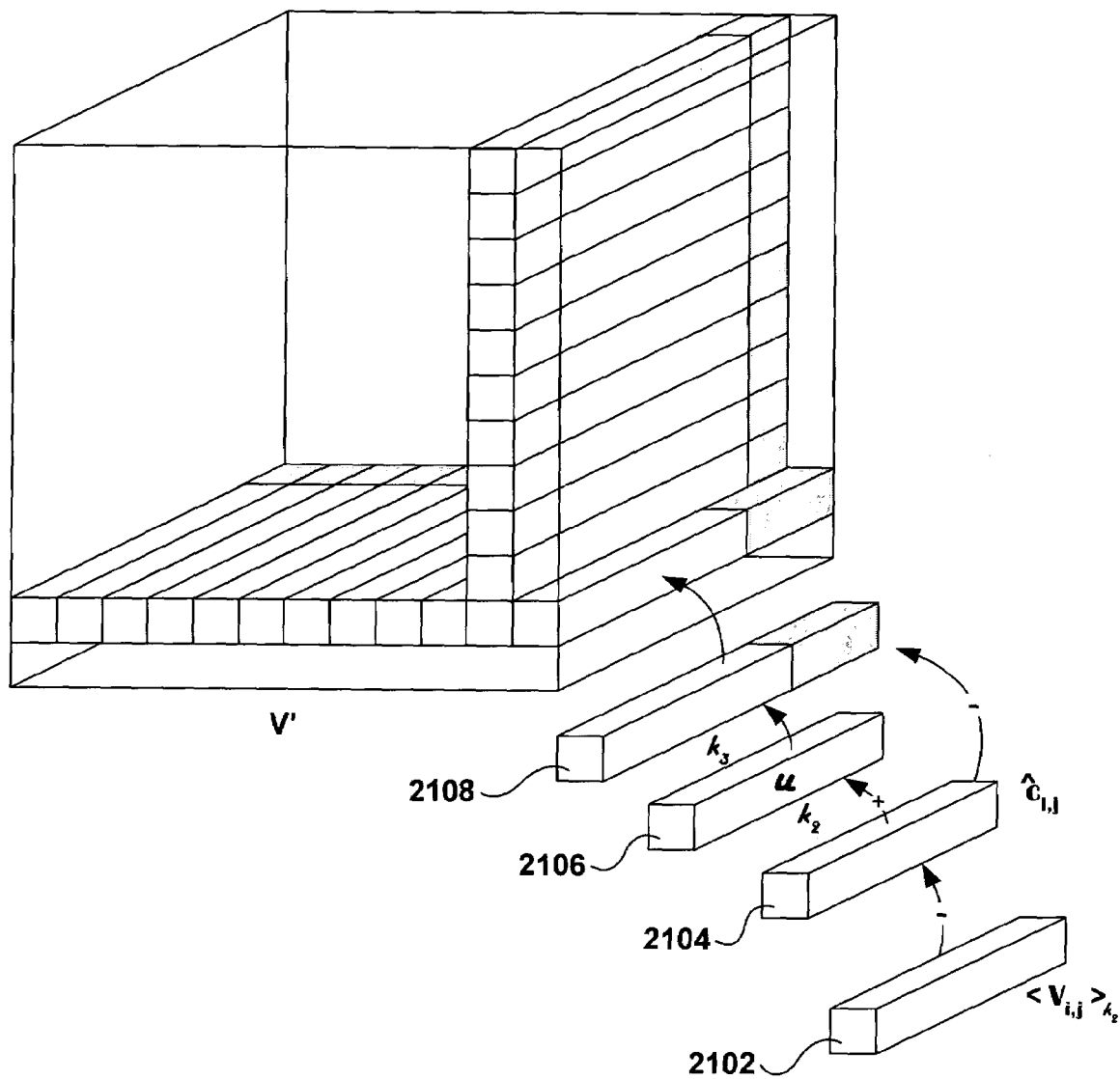
FIG. 21 illustrates the use of the computed projection vectors to store data into z-lines of the 3-dimensional data-storage volume V'.

Next, in the for-loops of lines 33–39 and 40–46, the right-most yz-slice and the bottom-most xz-slice of 3-dimensional data-storage volume V' are filled in via a rather complex operation involving computing and encoding projection vectors. This operation can be understood from examination of the above pseudocode, but can perhaps be best understood by examining the pseudocode concurrently with FIGS. 20–23. The right-most yz-slice involves computation of xz projection vectors. FIG. 20 illustrates the computation of projection vectors. As shown in FIG. 20, the projection vector $\hat{c}_{0,1}$ of length $k_z$ is computed by summing the values of all data-storage units within the xz-plane having y-axis coordinate 1 2002 and placing the sums into vector $\hat{c}_{0,1}$. In other words, for any particular z-axis coordinate, the data-storage unit of the projection vector $\hat{c}_{0,1}$ with a particular z-axis coordinate z contains the sum of all the data-storage units within the xz-plane 2002 having z-axis coordinate z. Similarly, projection vector $\hat{c}_{0,2}$ 2004 represents the sum of all z-lines in the xz-slice having y-axis coordinate 2 with x-axis coordinates between 1 and $r_x$–1. FIG. 21 illustrates the use of the computed projection vectors to create z-lines for storage into the 3-dimensional data-storage volume V'. As shown in FIG. 21, the corresponding z-line from the 3-dimensional data-storage volume V 2102 is subtracted from the computed projection vector 2104, and the result is added to $k_z$ information elements obtained from the input stream 2106. The resulting vector is encoded (on lines 38 and 45 of the routine "encode") by the systematic linear code $C_z$ to produce a codeword vector 2108, from which the projection vector is subtracted, that is stored into the 3-dimensional data-storage volume V' in a z-line with x-axis coordinate 0 and y-axis coordinate equal to the y-axis coordinate of the corresponding z-line from the 3-dimensional data-storage volume V 2102 subtracted from the computing projection vector.

Figure 22:
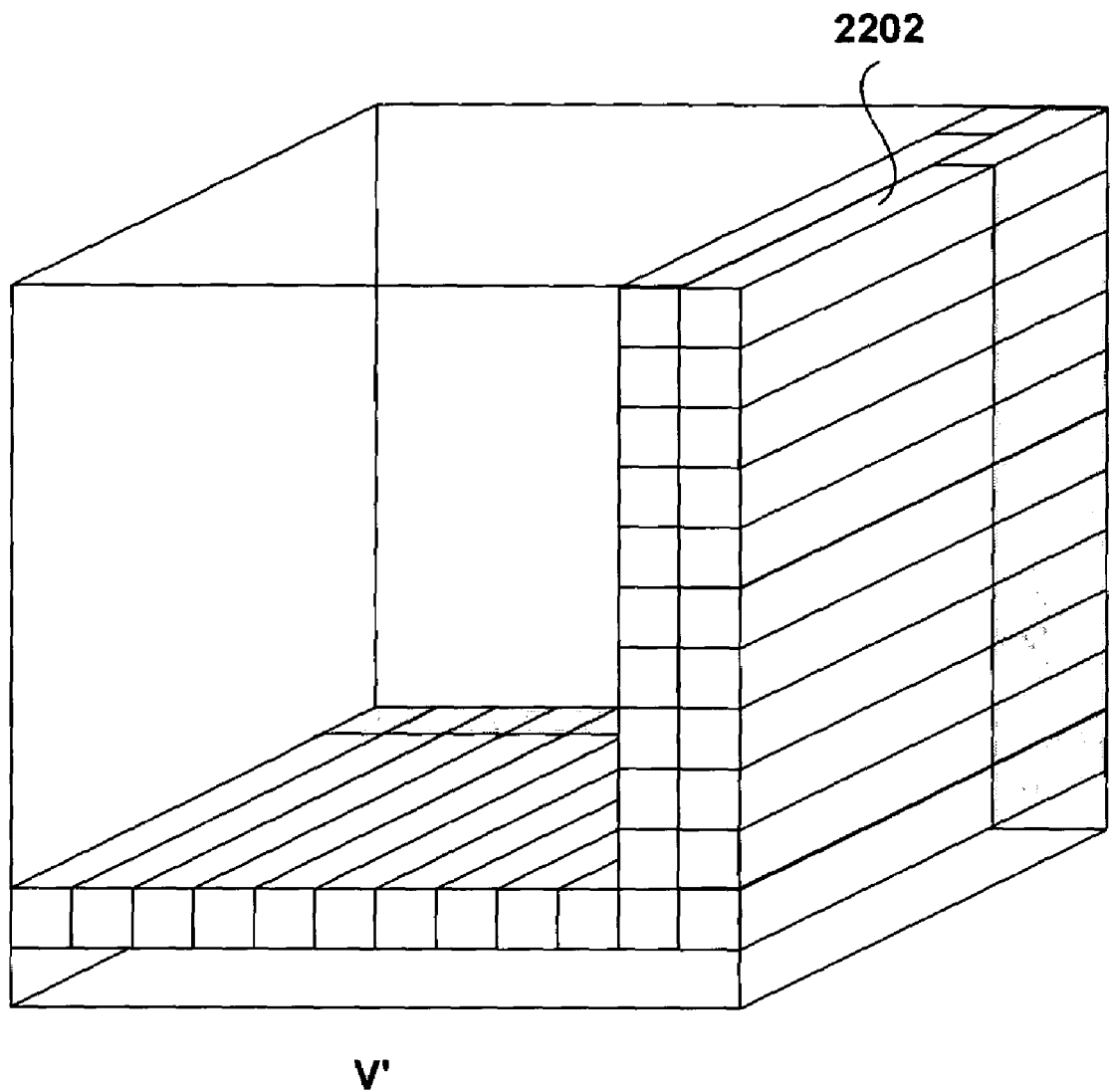
FIG. 22 illustrates data entry into the right-most yz-slice of the 3-dimensional data-storage volume V'.
Figure 23:
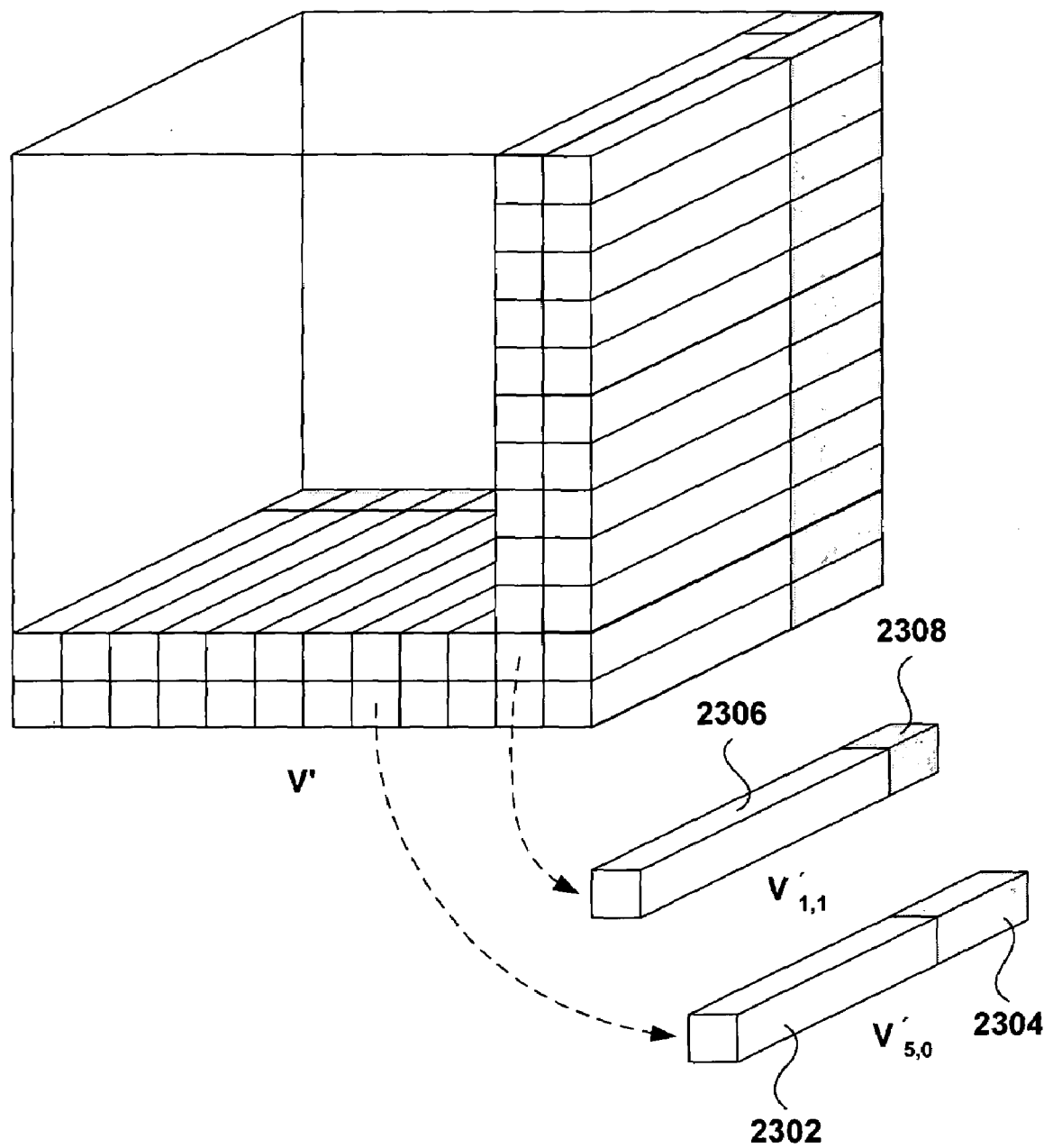
FIG. 23 illustrates parity-check symbols within the 3-dimensional data storage volume V'.

As shown in FIG. 22, completion of the for-loops of lines 33–39 leads to filling up the right-most yz-slice 2202, except for the first z-line in the yz-slice, of the 3-dimensional data-storage volume V'. Execution of the for-loop of lines 40–46 results in storing z-lines into the bottom-most horizontal xz-slice of the 3-dimensional data-storage volume V' that represent codewords of systematic linear-block code $C_z$. At the end of execution of the for-loop of lines 40–46, the 3-dimensional data-storage volume V' contains yz-slices with x coordinates between 0 and $r_x-1$ and xz-slices between y-axis coordinates of 0 to $r_y-1$. As shown in FIG. 23, these outermost z-lines of the 3-dimensional data-storage volume V', such as outmost z-line 2303, contain $k_z$ clear-text information symbols and $r_z$ 2304 parity-check symbols (shaded in FIG. 23), and the inner yz-slices and xz-slices contain z-lines having $k'_z$ clear-text information symbols 2306 and $r'_z$ parity-check symbols 2308.

Figure 24:
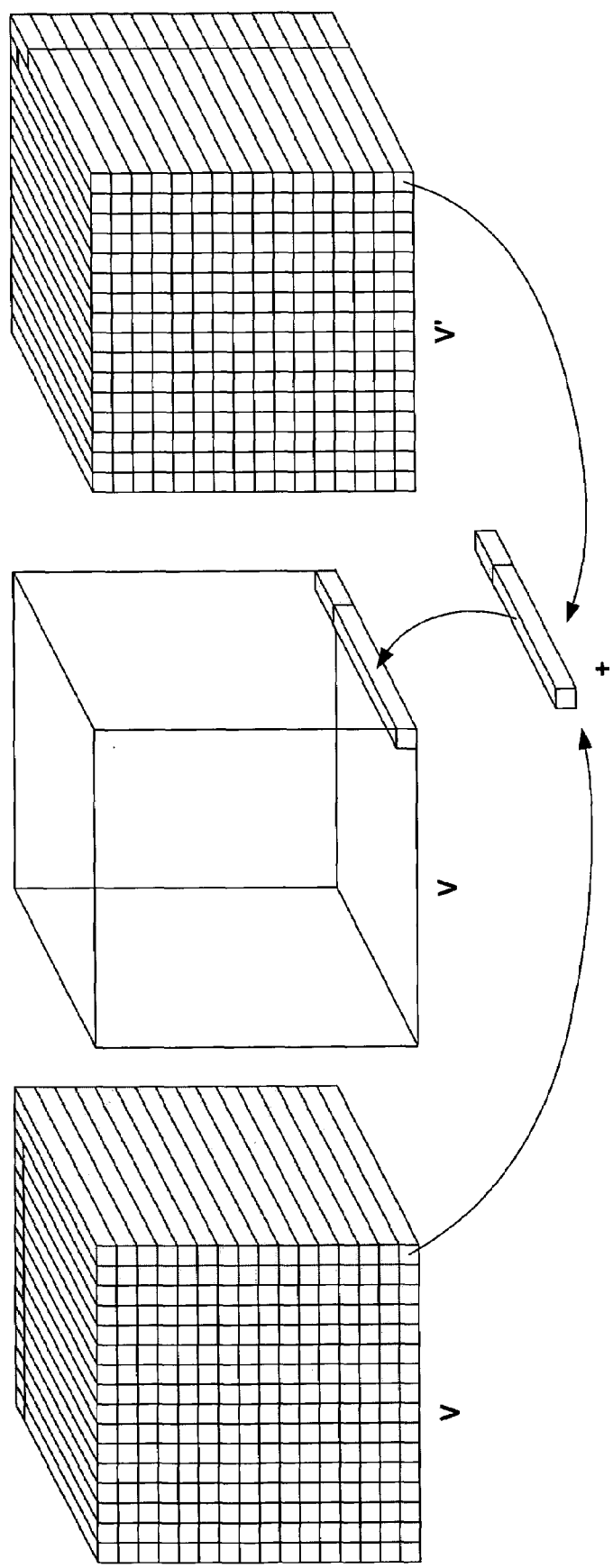
FIG. 24 illustrates the operation of nested for-loops of lines 51–55 of a pseudocode implementation of one embodiment of the present invention.
Figure 25:
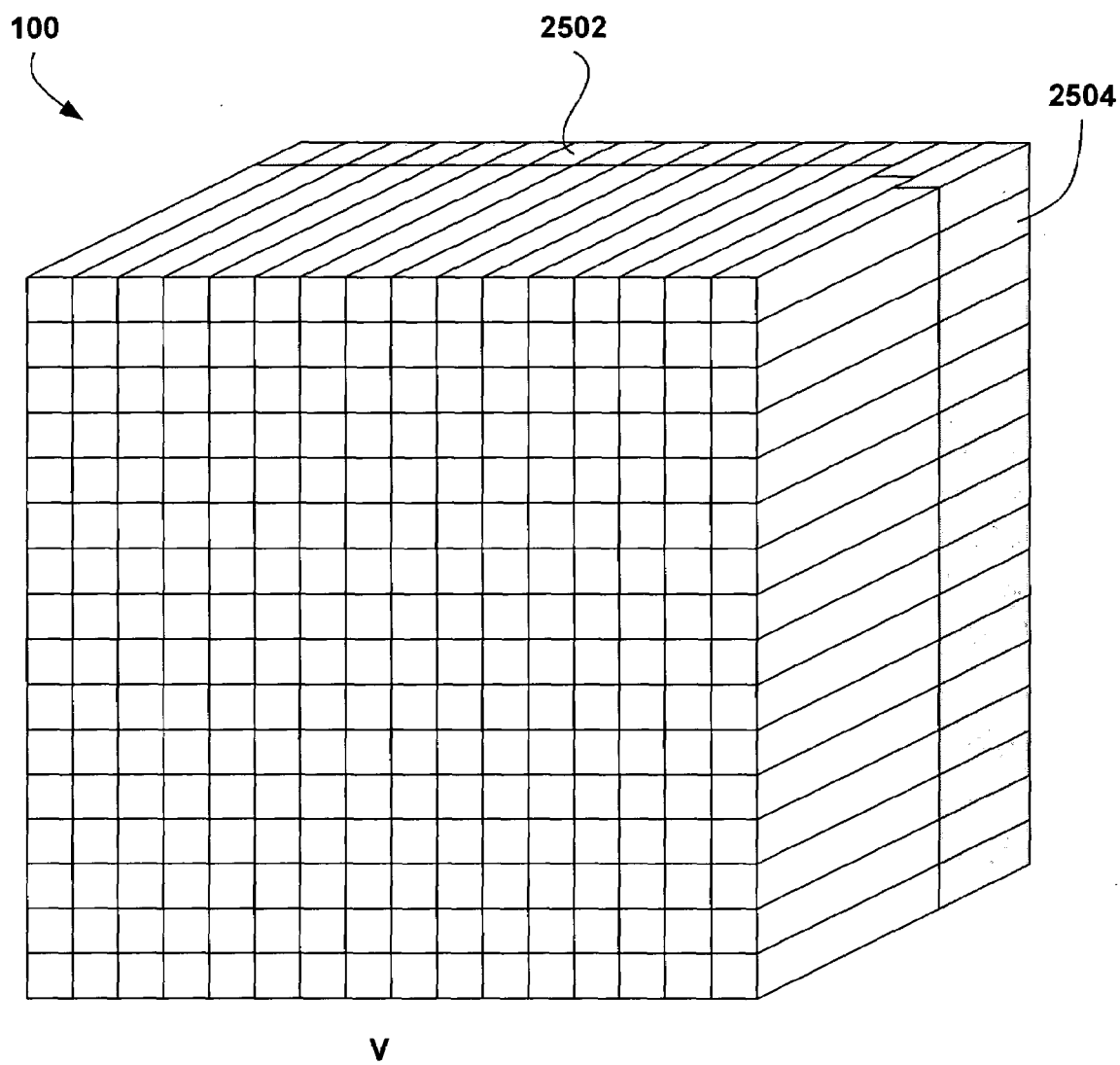
FIG. 25 illustrates the final result of the encoding operation carried out by the routine "encode."

Finally, in the nested for-loops of lines 47–51, the z-lines of 3-dimensional data-storage volume V+ and V are added together and stored into 3-dimensional data-storage volume V. FIG. 24 illustrates the operation of nested for-loops of lines 47–51. FIG. 25 illustrates the final result of the encoding operation carried out by the routine "encode." As shown in FIG. 25, the vast majority of data-storage units within the 3-dimensional data-storage volume V 100 contain clear-text information symbols, unshaded in FIG. 25. Only the xy-slice with z-axis coordinate "0" 2502, a small vertical region of parity-check symbols 2504, and an equally small horizontal region of parity-check symbols (not visible in FIG. 25) are contained in the 3-dimensional data-storage volume V.

Next, the routine "decode" is described. This routine is employed to determine whether or not errors produced by the Type1 and Type2 failure modes, described above, have occurred within a received or retrieved 3-dimensional data-storage volume $\tilde{\Gamma}$. The routine "decode" provides a method for decoding data in a 3-dimensional data-storage volume $\tilde{\Gamma}$ comprising a number of data-storage units. The method includes the steps of: computing initial syndrome volumes using transposes of parity-check matrices associated with a product code used to encode data values within the 3-dimensional data-storage volume $\tilde{\Gamma}$; computing secondary syndrome volumes from the initial syndrome volumes by applying a decoder to vectors within the initial syndrome volumes; determining a number of plane-corruption errors within the 3-dimensional data-storage volume $\tilde{\Gamma}$ from the secondary syndrome volumes and from a plane of $\tilde{\Gamma}$; and, when a plane-corruption error is detected, correcting the plane-corruption error by calculating an error volume and subtracting the error volume from 3-dimensional data-storage volume $\tilde{\Gamma}$.

The routine "decode" includes the following declarations:

```
1   ROUTINE DECODE:
2   Declarations:
3
4   t                             the number of Type 1 errors allowable in an encoded volume
5   F                             field of q elements
6   S_x, Ŝ_x, ΔS_x                volumes of cells of dimensions r_x by n_y by n_z, each cell
7                                 containing an element of field F
8   S_y, Ŝ_y, ΔS_y                volumes of cells of dimensions n_x by r_y by n_z, each cell
9                                 containing an element of field F
10  E                             volume of cells of dimensions n_x by n_y by n_z, each cell
11                                containing an element of field F
12  L                             set of distinct z indexes of xy slices
13                                includes members size( ), getFirst( ), and getNext( )
14                                which return the number of members of the set, the
15                                first member of the set, and successive next members
16                                of the set, respectively
17  Γ̃                             a received volume of cells of dimensions n_x by n_y by n_z,
18                                each cell containing an element of field F
19  Σ                             a plane of cells of dimensions n_x by n_y,
20                                each cell containing an element of field F
21  D1_x                          one-error-correcting decoder for systematic linear
22                                code C_x[n_x, k_x, 3] with r_x = n_x - k_x
23  D1_y                          one-error-correcting decoder for systematic linear
24                                code C_y[n_y, k_y, 3] with r_y = n_y - k_y
25  D1_z                          one-error-correcting decoder for systematic linear
26                                code C_z[n_z, k_z, 2t+1] with r_z = n_z - k_z
27  Dt_z                          t-error-correcting decoder for systematic linear
28                                code C_z[n_z, k_z, 2t+1]
29                                with r_z = n_z - k_z
30  D1'_z                         one-error-correcting decoder for systematic linear
31                                code C'_z [n_z, k'_z, t+1] with r_z = n_z - k'_z
32  Dt'_z                         t-erasure-correcting decoder for systematic linear
33                                code C'_z [n_z, k'_z, t+1] with r_z = n_z - k'_z
34  x, y, z                       integers
35  getData( )                    gets encoded volume containing information elements
36                                of field F and stores the information elements in Γ̃
37  error( )                      decoding failure routine
38  output(V)                     outputs corrected encoded volume containing information
39                                elements of field F
40
```

The constant t is, as declared above, on line 4, the number of criss-cross errors that the described encoding technique is designed to detect and correct by the described embodiment of the present invention. The syndrome volumes $S_x$, $\hat{S}_x$, $\Delta S_x$, $S_y$, $\hat{S}_y$, and $\Delta S_y$, declared above on lines 6–9, are all volumes of data-storage units, with dimensions specified in the above declarations, that are used to store computed syndromes for the received 3-dimensional data-storage volume $\tilde{\Gamma}$, declared above on lines 17–18. The 3-dimensional data-storage volume E, declared above on lines 10–11, stores an error volume that is a 3-d analog to the above-described error vector e. The set L, declared above on lines 12–16, contains z indexes of xy-slices of the received 3-dimensional data-storage volume $\tilde{\Gamma}$ that are determined to contain errors. The set L uses member functions "size," "getFirst," and "getNext" for reporting the number of contained z indexes and for accessing the contained z indexes. A plane of cells of dimensions $n_x$ by $n_y$ is declared as cell-array "$\Sigma$," on lines 19–20. This cell-array is used for summing z-planes of $\tilde{\Gamma}$. The decoders $D1_x$, $D1_y$, $D1_z$, $Dt_z$, $D1'_z$, and $Dt'_z$, declared above on lines 21–33, are linear-block decoders corresponding to the systematic linear-block encoders used in the above-described routine "encode." These decoders are described in the accompanying comments in the above declarations. On line 34, integers x, y, and z are declared for use within the routine "decode." The function "getData," declared above on line 35, obtains encoded information elements from a data-storage or data-transmission source and places them into 3-dimensional data-storage volume $\tilde{\Gamma}$. The function "error," declared above on line 37, reports decoding failures. The function "output," declared above on line 38, outputs corrected encoded information symbols to an output stream.

The routine "decode" employs the subroutine computeE, provided below:

1 Routine computeE(z)
2
3 compute and return Ez that satisfies the two equations:
4 $\Delta S_{x_z} = E_z H_x^T$
5 $\Delta S_{y_z} = E_z H_y^T$ This subroutine computes an error volume xy-slice $E_z$ that satisfies the two matrix equations provided on lines 4 and 5 of the routine. $H_x^T$ and $H_y^T$ are obtained by transposing the parity-check matrices $H_x$ and $H_y$ for the systematic linear-block codes $C_x$ and $C_y$ used in the routine "encode," described above. Calculating an error-volume xy-slice that satisfies the two constraint equations is a well-known mathematical problem in error-control coding and decoding, and various well-known techniques can be supplied by one ordinarily skilled in the art. This calculation involves using decoders $D1_x$ and $D1_y$. From each x-line in $\Delta S_{x_z}$, $D1_x$ computes the respective x-line in $E_z$. Then, from each y-line in $\hat{S}_{y_z}$, $D1_y$ computes the respective y-line in $E_z$. Referring to FIG. 4, let $E_z$ be the xy-slice that contains the criss-cross pattern in that figure, regarding that pattern to be an error pattern. Since each x-line in $E_2$, except x-line 402, contains at most one error, the decoder $D1_x$ reconstructs all the entries of the y-line 404 within $E_z$ except possibly 406, yet it may decode incorrectly x-line 402. That leaves only one corrupted x-line in $E_2$, x-line 402, which is then corrected to $D1_y$.

The main body of the routine "decode" follows:

```
1  Main (Decode):
2
3     getData( );
4     for (z = 0; z < n_z; z++)
5     {
6        Ŝ_x_z = Γ̃_z H_x^T;
7        Ŝ_y_z = Γ̃_z H_y^T;
8     }
9     E = 0;
10    for (x = 0, y = 0; y < n_y; y++)
11    {
12       S_x_xy = Dt_z( Ŝ_x_xy );
13    }
14    for (x = 0, y = 0; x < n_x; x++)
15    {
16       S_y_xy = Dt_z( Ŝ_y_xy );
17    }
18
19    L = 0;
20
21    for (z = 0; z < n_z; z++)
22    {
23       if ( S_y_z ≠ Ŝ_y_z || S_x_z ≠ Ŝ_x_z ) L += z;
24    }
25    if (L.size( ) == 0)
26    {
27       Σ = 0;
28       for (z = 0; z < n_z; z++)
29       {
30          Σ += Γ̃_z
31       }
32       if (Σ ≠ 0)
33       {
34          if (t == 1)
35          {
36             error( );
37             return;
38          }
39          for (x = 1; x < r_x; x++)
40             for (y = 1; y < r_y; y++)
41             {
42                if ( D1'_z ( Ŝ_y_xy ) ≠ Ŝ_y_xy || D1'_z ( Ŝ_x_xy ) ≠ Ŝ_x_xy ) L += z;
43             }
44          if (L.size( ) ≠ 1)
45          {
46             error( );
47             return;
48          }
49       }
50       else
51       {
52          output(Γ̃);
53          return;
54       }
55    }
56    if (L.size( ) == 1)
57    {
58       for (z = 0; z < n_z; z++) E_L.getFirst( ) += Γ̃_z;
59       output(Γ̃ - E);
60    }
61    else if (L.size( ) > 1 && L.size( ) <= t)
62    {
63       for (x = 1; x < r_x; x++)
64          for (y = 0; y < n_y; y++)
65          {
66             S_x_xy = Dt'_z ( Ŝ_x_xy , L);
67          }
68       for (y = 1; y < r_y; y++)
69          for (x = 0; x < n_x; x++)
70          {
71             S_y_xy = Dt'_z ( Ŝ_y_xy , L);
72          }
73       ΔS_x = Ŝ_x - S_x;
74       ΔS_y = Ŝ_y - S_y;
75       z = L.getFirst( );
76       do
77       {
```

```
78          computeE(z);
79        }
80        while (z = L.getNext( ));
81        output(Γ̃ − E);
82      }
83    else error( );
84    return;
```

Figure 26:
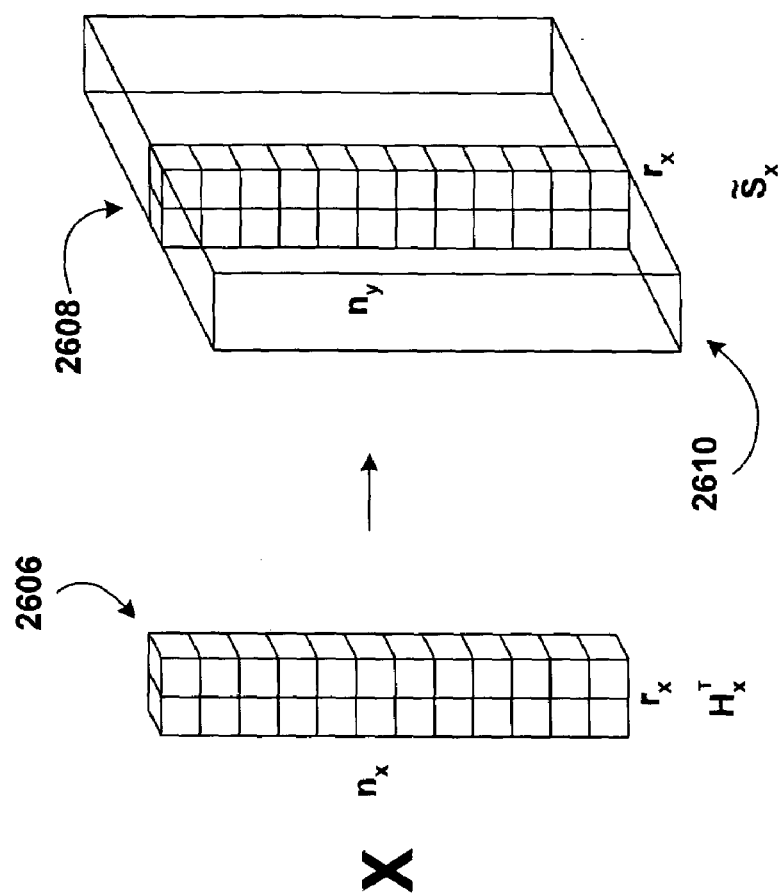
FIG. 26 illustrates the computation of a syndrome volume $\hat{S}_x$.
Figure 26:
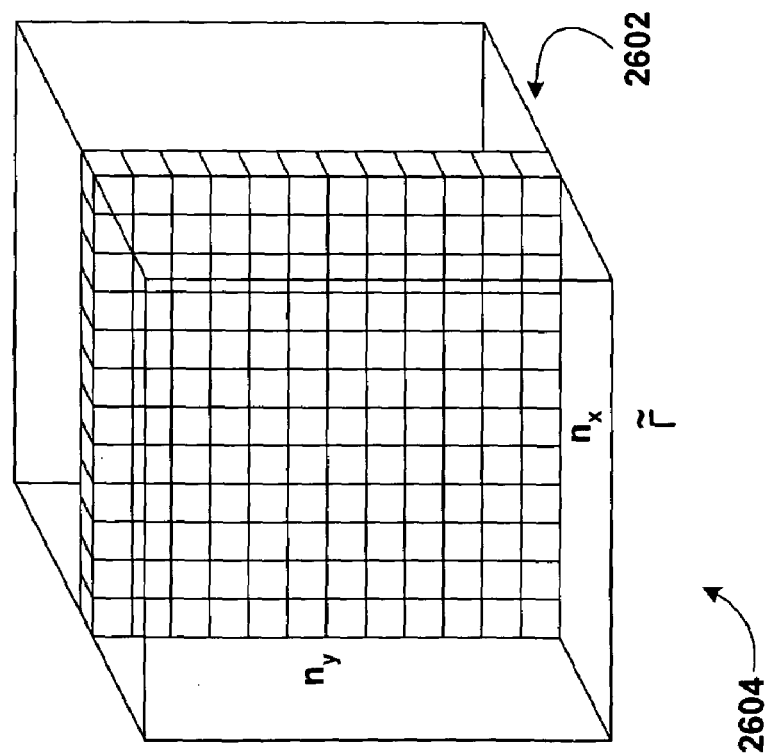
Figure 27:
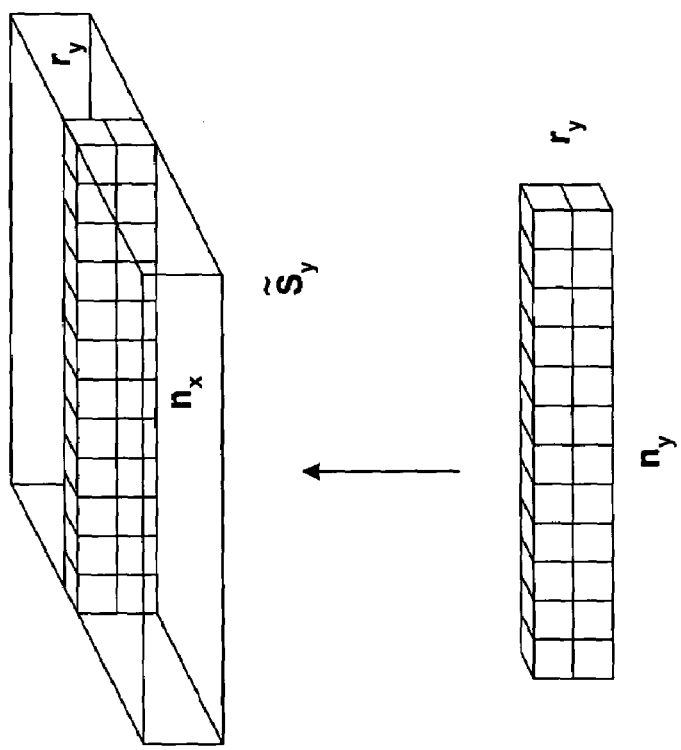
FIG. 27 illustrates, in a fashion similar to 26, computation of a syndrome volume $\hat{S}_y$.
Figure 27:
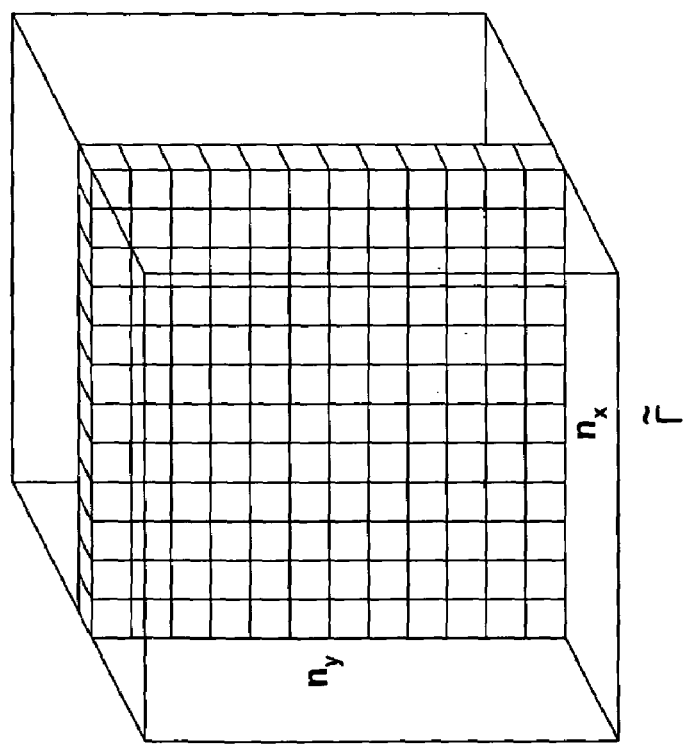

First, on line 3, above, the received or retrieved encoded information is obtained and placed into the 3-dimensional data-storage volume Γ̃, via a call to the routine getData. Next, in the for-loop of lines 4–8, the two initial syndrome volumes $\hat{S}_{x_z}$ and $\hat{S}_{y_z}$ are computed by matrix multiplication of successive xy-slices within the 3-dimensional data-storage volume Γ̃ by the transposes of the parity-check matrices $H_x$ and $H_y$ for the systematic linear-block codes $C_x$ and $C_y$ used in the routine "encode," described above. FIG. 26 illustrates computation of the syndrome volume $\hat{S}_x$. Each xy-slice, such as xy-slice 2602, in 3-dimensional data-storage volume Γ̃ 2604, is multiplied by the $n_x$ by $r_x$ transpose of the parity-check matrix $H_x$ for code $C_x$ 2606 to produce an $n_y$ by $r_x$ xy-slice 2608 within the syndrome volume $\hat{S}_x$ 2610. FIG. 27 illustrates, in a fashion similar to 26, computation of the syndrome volume $\hat{S}_y$.

On line 9, the error volume E is set to contain value "0" in all data-storage units. Then, secondary syndrome volumes are computed from the initial syndrome volumes by applying a decoder to vectors within the initial syndrome volumes. In the for-loop of lines 10–13, z-lines for the syndrome volume $S_x$ are computed by decoding corresponding z-lines from the syndrome volume $\hat{S}_x$. Similarly, z-lines of the syndrome volume $S_y$ are computed by decoding corresponding z-lines of the syndrome volume $\hat{S}_y$ in the for-loop of lines 14–17. On line 19, the set L is initialized to contain no z-coordinates. Next, in the for-loop of lines 21–24, each xy-slice within the syndrome volumes $S_x$ and $S_y$ is examined to detect corrupted xy-slices, and each detection of a corrupted xy-slice with a z-axis coordinate z results in placing that z-axis coordinate z into the set L. The number of plane-corruption errors can be determined based on the number of z-axis coordinates placed into the set L.

On line 25, the routine "decode" determines whether any errors were detected in the for-loop of lines 21–24. If so, then, on line 27, the routine "decode" sets the cell-array Σ to contain 0 values, and then, in the for-loop of lines 28–31, sums the xy-slices of Γ̃ into Σ. Next, on line 32, the routine "decode" determines whether or not any parity errors are present in the 3-dimensional data-storage volume Γ̃, indicated by non-zero values in Σ. If so, then if the value of t is 1, a decoding error is returned on line 36 and the routine "decode" terminates on line 37. When t is 1, no errors can be corrected. Next, in the nested for-loops of lines 39–43, z-lines of the syndrome volumes $\hat{S}_x$ and $\hat{S}_y$ are checked to detect errors and, if errors are found, the z-axis coordinates of the $n_y$-slices are stored in the set L. If the set L now has a size different from 1, as detected by the routine "decode" on line 44, then an error is returned on line 46, and the routine "decode" terminates on line 47. Termination is appropriate in this case because, as discussed above, no more than one corrupted xy-slice can be corrected by the error-control coding and decoding technique that represents one embodiment of the present invention. Otherwise, when there are no detected errors, as determined above on line 25, then the encoded information symbols within the 3-dimensional data-storage volume Γ̃ can be output, on line 52, and the routine "decode" terminates, on line 53. Note that the clear-text information symbols can be extracted from the output encoded information symbols by simply extracting the clear-text information symbols in an order opposite to the order in which they were stored during encoding by the routine "encode."

Next, the routine "decode" determines whether a single error has been detected, on line 56. If so, a single plane-corruption error has been detected, and the plane-corruption error can be corrected by calculating an error volume and subtracting the error volume from the 3-dimensional data-storage volume Γ̃. The xy-slice within the error volume E can be computed by summing all the xy-slices within the 3-dimensional data-storage volume Γ̃, and the error volume can be subtracted from the 3-dimensional data-storage volume Γ̃ and output, on line 59. If there is more than 1, and less than, or equal to, t detected errors, as determined on line 61, then, in the for-loops of lines 63–67 and 68–72, the routine "decode" finishes computation of the syndrome volumes $S_x$ and $S_y$ by decoding corresponding z-lines of the syndrome volumes $\hat{S}_x$ and $\hat{S}_y$. Then, on lines 73 and 74, the routine "decode" computes the difference syndrome volumes $\Delta S_x$ and $\Delta S_y$ by subtracting the computed initial syndrome volumes from the computed secondary syndrome volumes. Then, in the while-loop of lines 76–80, the routine "decode" computes xy-slices of the error volume E and, finally, outputs the result of subtracting the error volume E from the 3-dimensional data-storage volume Γ̃. However, if there are greater than t errors, or, in other words, the number of errors exceeds the designed limitations of the error-correcting technique that represents one embodiment of the present invention, then an error is returned on line 83.

Although the present invention has been described in terms of a particular embodiment, it is not intended that the invention be limited to this embodiment. Modifications within the spirit of the invention will be apparent to those skilled in the art. For example, the method of the present invention can be implemented in an almost limitless number of ways using any of a large number of programming languages and an almost limitless number of different control structures, modular organizations, and other such characteristics. In special cases, certain efficiencies can be gained by short circuiting for-loops and by multiplying and otherwise processing submatrices rather than full matrices. The techniques of the present invention may be applied to 3-dimensional data-storage volumes of many different dimensions containing elements from an almost limitless number of different types of fields. A wide variety of suitable systematic linear-block encoders and corresponding decoders can be employed by the present invention. Of course, the orientation of the logical x, y, and z-axes, and the other components and subcomponents of the 3-dimensional data-storage volumes can be arbitrarily oriented with respect to the physical data-storage medium. Should additional error detection and correction capabilities be needed, alternate methods within the scope of the present invention may be devised. For example, 2 or more xy-slice errors may be corrected when a greater number of parity-check symbols are employed. Although methods representing embodiments of the present invention are described above, the present invention encompasses various software implementations of these methods and computer systems that employ these methods to encode information into 3-dimensional storage volumes.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

The invention claimed is:

1. A method for encoding data into a 3-dimensional data-storage volume comprising a number of data-storage units the method comprising:
    receiving a sequence of data;
    encoding the sequence of data using a linear product code to encode data into code arrays of data values wherein the code arrays are stored as planes within the 3-dimensional data-storage volume, and using two linear block codes to encode data into vectors of data values;
    wherein the data-storage units of the 3-dimensional data-storage volume are indexed with respect to three coordinate axes x,y, and z, with $n_x$ data-storage indexes in an x direction, $n_y$ data-storage indexes in a y direction, and $n_z$ data-storage indexes in a z direction; and
    wherein the linear block codes include
        a product code $C_xC_y$ that encodes $k_xk_y$ data values into a code array of dimensions $n_xn_y$ with $r_xr_y$ parity-check values,
        a linear block code $C_z$ that encodes $k_z$ data values into a vector of length $n_z$ with $r_x=n_x-k_z$ parity check values, and
        a linear block code $C'_z$ that encodes $k'_z$ data values into a vector of length $n_z$ with $r'_z$ parity check values.

2. A method for encoding data into a 3-dimensional data-storage volume comprising a number of data-storage units, the method comprising:
    receiving a sequence of data;
    encoding the sequence of data using a linear product code to encode data into code arrays of data values wherein the code arrays are stored as planes within the 3-dimensional data-storage volume, and using two linear block codes to encode data into vectors of data values;
    wherein $k_xk_y(n_z-1)$ data values are encoded into $n_z-1$ planes normal to the z direction starting with the plane having z-axis coordinate 0;
    wherein $k'_x(n_xn_y-n_x-n_y+1-k_xk_y)$ data values are encoded into planes normal to the x direction with x-axis coordinates of between 1 and $r_x-1$ and planes normal to the y direction with y-axis coordinates of between 1 and $r_y-1$; and
    wherein $k_z(n_x+n_y+1)$ data values are encoded into a plane normal to the x direction with x-axis coordinate 0 and a plane normal to the y direction with y-axis coordinate 0.

3. A method for decoding data in a 3-dimensional data-storage volume $\tilde{\Gamma}$ comprising a number of data-storage units, the method comprising:
    computing initial syndrome volumes using transposes of parity-check matrices associated with a product code used to encode data values within the 3-dimensional data-Storage volume $\tilde{\Gamma}$;
    computing secondary syndrome volumes from the initial syndrome volumes by applying a decoder to vectors within the initial syndrome volumes;
    determining a number of plane-corruption errors within the 3-dimensional data-storage volume $\tilde{\Gamma}$ from the secondary syndrome volumes and from a plane of $\tilde{\Gamma}$; and
    when a plane-corruption error is detected, correcting the plane-corruption error by calculating an error volume and subtracting the error volume from 3-dimensional data-storage volume $\tilde{\Gamma}$.

4. The method of claim 3 further including computing difference syndrome volumes from the initial syndrome volumes and the secondary syndrome volumes completed using a linear block decoder, and correcting criss-cross errors within the 3-dimensional data-storage volume $\tilde{\Gamma}$ by computing an error volume from the difference syndrome volumes and subtracting the error volume from the 3-dimensional data-storage volume $\tilde{\Gamma}$.

5. The method of claim 4
    wherein the data-storage units of the 3-dimensional data-storage volume $\tilde{\Gamma}_z$ are indexed with respect to three coordinate axes x, y, and z, with data-storage indexes ranging from 0 to $n_x-1$ in an x direction, 0 to $n_y-1$ in a y direction, and 0 to $n_z-1$ in a z direction;
    wherein planes of the initial syndrome volumes $\hat{S}_x$ and $\hat{S}_y$ normal to the z direction are calculated from transposes of parity-check matrices by $\hat{S}_{x_z}=\tilde{\Gamma}_zH_x^T$ and by $\hat{S}_{y_z}=\tilde{\Gamma}_zH_y^T$;
    wherein secondary syndrome volumes $S_x$ and $S_y$ are calculated from the initial syndrome volumes by decoding vectors within $\hat{S}_x$ and $\hat{S}_y$ in the z direction using a linear block decoder $Dt_y$;
    wherein an initial number of plane-corruption errors is determined by the number of planes in $S_x$ and $S_y$ normal to the z direction containing non-zero values; and
    wherein, when the plane of $\tilde{\Gamma}_z$ normal to the z direction with z-axis coordinate 0 is non-zero, the number of plane-corruption errors further includes the number of non-zero vectors in the z direction of $\hat{S}_x$ and $\hat{S}_y$ decoded by linear block decoder $D_{t_z}$.

* * * * *

UNITED STATES PATENT AND TRADEMARK OFFICE
CERTIFICATE OF CORRECTION

PATENT NO. : 7,206,987 B2
APPLICATION NO. : 10/427525
DATED : April 17, 2007
INVENTOR(S) : Ron M. Roth et al.

It is certified that error appears in the above-identified patent and that said Letters Patent is hereby corrected as shown below:

In column 4, line 2, below "or, alternatively, as:" insert -- $V_{z=c}$ --.

In column 5, line 62, delete "$\mu(s) \rightarrow c(s) = c(r) = \mu(r)$" and insert -- $\mu(s) \rightarrow c(s) \rightarrow c(r) \rightarrow \mu(r)$ --, therefor.

In column 7, line 57, delete "$s_i = (c(r)_i - c(r)_{r0,i} - c(r)_{r+1} P_{1,i} - c(r)_{r+2} P_{2,i} - \ldots - c(r)_{n-1} P_{k-1,i})$" and insert -- $s_i = (c(r)_i - c(r)_r P_{0,i} - c(r)_{r+1} P_{1,i} - c(r)_{r+2} P_{2,i} - \ldots - c(r)_{n-1} P_{k-1,i})$ --, therefor.

In column 9, line 51, after "$C_x, C_y,$" delete "$C_2,$" and insert -- $C_z$ --, therefor.

In column 15, line 7, delete "they-axis" and insert -- the y-axis --, therefor.

In column 17, line 66, delete "$E_2$" and insert -- $E_z$ --, therefor.

In column 21, line 19, in Claim 1, after "units" insert -- , --.

In column 21, line 36, in Claim 1, delete "$r_x = n_x - k_z$" and insert -- $r_z = n_z - k_z$ --, therefor.

In column 21, line 52, in Claim 2, delete "$k'_x(n_x n_y - n_x - n_y + 1 - k_x k_y)$" and insert -- $k'_z(n_x n_y - n_x - n_y + 1 - k_x k_y)$ --, therefor.

In column 22, line 3, in Claim 2, after "to" delete "they direction" and insert -- the y direction --, therefor.

In column 22, line 11, in Claim 3, delete "data-Storage" and insert -- data-storage --, therefor.

In column 22, line 40, in Claim 5, delete " $\hat{S}_{x_z} = \tilde{\Gamma}_x H_x^T$ " and insert -- $\hat{S}_{x_z} = \tilde{\Gamma}_z H_x^T$ --, therefor.

UNITED STATES PATENT AND TRADEMARK OFFICE
CERTIFICATE OF CORRECTION

PATENT NO.       : 7,206,987 B2
APPLICATION NO.  : 10/427525
DATED            : April 17, 2007
INVENTOR(S)      : Ron M. Roth et al.

It is certified that error appears in the above-identified patent and that said Letters Patent is hereby corrected as shown below:

In column 22, line 45, in Claim 5, delete "$Dt_y$" and insert -- $D1_z$ --, therefor.

In column 22, line 54, in Claim 5, delete "$D_z$" and insert -- $D1'_z$ --, therefor.

Signed and Sealed this

Third Day of November, 2009

David J. Kappos
*Director of the United States Patent and Trademark Office*